(12) United States Patent
Shibazaki

(10) Patent No.: US 8,411,271 B2
(45) Date of Patent: Apr. 2, 2013

(54) PATTERN FORMING METHOD, PATTERN FORMING APPARATUS, AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 645 days.

(21) Appl. No.: 11/646,559

(22) Filed: Dec. 28, 2006

(65) Prior Publication Data

US 2007/0159632 A1 Jul. 12, 2007

Related U.S. Application Data

(60) Provisional application No. 60/772,880, filed on Feb. 14, 2006.

(30) Foreign Application Priority Data

Dec. 28, 2005 (JP) ................................ 2005-377706

(51) Int. Cl.
| | |
|---|---|
| *G01B 11/00* | (2006.01) |
| *G01B 11/14* | (2006.01) |
| *G01N 21/86* | (2006.01) |
| *G03F 9/00* | (2006.01) |
| *G03C 5/00* | (2006.01) |
| *G03B 27/42* | (2006.01) |
| *G06K 9/00* | (2006.01) |

(52) U.S. Cl. .......... 356/401; 356/614; 250/548; 430/22; 430/30; 355/53; 382/151
(58) Field of Classification Search ........................ None
See application file for complete search history.

(56) References Cited

U.S. PATENT DOCUMENTS

| | | | |
|---|---|---|---|
| 4,346,164 A | 8/1982 | Tabarelli et al. | |
| 4,465,368 A | 8/1984 | Matsuura et al. | |
| 4,480,910 A | 11/1984 | Takanashi et al. | |
| 4,780,617 A | 10/1988 | Umatate et al. | |
| 4,842,412 A * | 6/1989 | Miyake | 356/401 |
| 5,220,176 A * | 6/1993 | Kawai | 250/548 |
| 5,225,686 A | 7/1993 | Edo | |
| 5,243,195 A | 9/1993 | Nishi | |
| 5,489,986 A * | 2/1996 | Magome et al. | 356/401 |
| 5,528,027 A * | 6/1996 | Mizutani | 250/234 |
| 5,610,683 A | 3/1997 | Takahashi | |
| 5,646,413 A | 7/1997 | Nishi | |
| 5,715,039 A | 2/1998 | Fukuda et al. | |
| 5,825,043 A | 10/1998 | Suwa | |

(Continued)

FOREIGN PATENT DOCUMENTS

| | | |
|---|---|---|
| DE | 221 563 A1 | 4/1985 |
| DE | 224 448 A1 | 7/1985 |

(Continued)

OTHER PUBLICATIONS

Office Action issued to the corresponding Israeli Application No. 192123 on Jul. 6, 2011. (with English language Translation).

(Continued)

*Primary Examiner* — Gordon Stock, Jr.
(74) *Attorney, Agent, or Firm* — Oliff & Berridge, PLC

(57) ABSTRACT

A plurality of wafer marks on a wafer is detected while a wafer stage moves from a loading position where a wafer is delivered onto the wafer stage to an exposure starting position where exposure of a wafer begins, with a part of an alignment system also moving, using the alignment system. Accordingly, the time required for mark detection can be reduced, therefore, it becomes possible to increase the throughput of the entire exposure process.

127 Claims, 14 Drawing Sheets

U.S. PATENT DOCUMENTS

| | | | |
|---|---|---|---|
| 5,969,441 | A | 10/1999 | Loopstra et al. |
| 6,208,407 | B1 | 3/2001 | Loopstra |
| 6,525,804 | B1* | 2/2003 | Tanaka ............................. 355/53 |
| 6,590,634 | B1 | 7/2003 | Nishi et al. |
| 6,611,316 | B2 | 8/2003 | Sewell |
| 6,778,257 | B2 | 8/2004 | Bleeker et al. |
| 6,897,956 | B2* | 5/2005 | Noguchi et al. .............. 356/401 |
| 6,897,963 | B1 | 5/2005 | Taniguchi et al. |
| 6,950,188 | B2* | 9/2005 | Wu et al. ....................... 356/401 |
| 7,023,610 | B2 | 4/2006 | Ohtsuki et al. |
| 7,362,446 | B2* | 4/2008 | Van Der Pasch et al. ..... 356/499 |
| 2001/0055117 | A1* | 12/2001 | Mizutani ....................... 356/401 |
| 2002/0041377 | A1 | 4/2002 | Hagiwara et al. |
| 2002/0061469 | A1 | 5/2002 | Tanaka |
| 2003/0059691 | A1* | 3/2003 | Morimoto ....................... 430/22 |
| 2003/0098959 | A1 | 5/2003 | Hagiwara et al. |
| 2004/0165159 | A1 | 8/2004 | Lof et al. |
| 2005/0133727 | A1* | 6/2005 | Banine et al. ................. 250/397 |
| 2006/0092419 | A1* | 5/2006 | Gui ................................. 356/401 |
| 2006/0121364 | A1 | 6/2006 | Omura |
| 2006/0231206 | A1 | 10/2006 | Nagasaka et al. |
| 2009/0190111 | A1* | 7/2009 | Van Empel ....................... 355/53 |
| 2010/0091297 | A1* | 4/2010 | Van Bilsen ..................... 356/509 |

FOREIGN PATENT DOCUMENTS

| | | |
|---|---|---|
| EP | 1-420-298 A2 | 5/2004 |
| EP | 1 630 585 A1 | 3/2006 |
| JP | A 57-117238 | 7/1982 |
| JP | A 58-202448 | 11/1983 |
| JP | A 59-019912 | 2/1984 |
| JP | A 61-44429 | 3/1986 |
| JP | A 62-065326 | 3/1987 |
| JP | A 63-157419 | 6/1988 |
| JP | A 1-214021 | 8/1989 |
| JP | A 04-120716 | 4/1992 |
| JP | A-04-120716 | 4/1992 |
| JP | A 04-305915 | 10/1992 |
| JP | A 04-305917 | 10/1992 |
| JP | A 5-21314 | 1/1993 |
| JP | A 05-062877 | 12/1993 |
| JP | A 06-124873 | 5/1994 |
| JP | A 7-176468 | 7/1995 |
| JP | A 07-220990 | 8/1995 |
| JP | 08045814 A * | 2/1996 |
| JP | A-08-045814 | 2/1996 |
| JP | A 08-31625 | 11/1996 |
| JP | A-08-316125 A | 11/1996 |
| JP | A 09-092593 | 4/1997 |
| JP | A 10-163099 | 6/1998 |
| JP | A 10-214783 | 8/1998 |
| JP | A 10-223528 | 8/1998 |
| JP | A 10-270348 | 10/1998 |
| JP | A 10-303114 | 11/1998 |
| JP | A 10-340846 | 12/1998 |
| JP | A 11-10816 | 1/1999 |
| JP | A 11-135400 | 5/1999 |
| JP | A 11-176727 | 7/1999 |
| JP | A 2000-058436 | 2/2000 |
| JP | A 2000-505958 | 5/2000 |
| JP | A 2000-164504 | 6/2000 |
| JP | A 2002-14005 | 1/2002 |
| JP | B2 3303336 | 7/2002 |
| JP | 2003-241396 | 8/2003 |
| JP | A 2004-519850 | 7/2004 |
| WO | WO 99/23092 | 5/1999 |
| WO | WO 99/46835 | 9/1999 |
| WO | WO 99/49504 | 9/1999 |
| WO | WO 01/35168 A1 | 5/2001 |
| WO | WO 02/069049 A2 | 9/2002 |
| WO | WO 02/103766 A1 | 12/2002 |
| WO | WO 03/065428 A1 | 8/2003 |
| WO | WO 2004/019128 A2 | 3/2004 |
| WO | WO 2004/055803 A1 | 7/2004 |
| WO | WO 2004/057590 A1 | 7/2004 |
| WO | WO 2004/107011 A1 | 12/2004 |
| WO | WO 2005/029559 A1 | 3/2005 |

OTHER PUBLICATIONS

Written Opinion issued in co-pending Application No. PCT/JP2006/326248 on Apr. 10, 2007. (with Translation).

Nov. 29, 2011 Office Action issued in Japanese Patent Application No. 2007-552985 (with English translation).

Sep. 18, 2012 Office Action issued in Korean Patent Application No. 10-2008-7011529 w/translation.

* cited by examiner

PATTERN FORMING METHOD, PATTERN FORMING APPARATUS, AND DEVICE MANUFACTURING METHOD

CROSS-REFERENCE TO RELATED APPLICATIONS

This non-provisional application claims the benefit of Provisional Application No. 60/772,880 filed Feb. 14, 2006, the disclosure of which is hereby incorporated herein by reference in its entirety.

BACKGROUND OF THE INVENTION

1. Field of the Invention

The present invention relates to pattern forming methods, pattern forming apparatuses, and device manufacturing methods, and more particularly to a pattern forming method and a pattern forming unit for forming a pattern on an object, and a device manufacturing method that uses the pattern forming method and the pattern forming apparatus.

2. Description of the Background Art

In a lithography process for manufacturing microdevices (electronic devices) such as a semiconductor, a liquid crystal display device or the like, an exposure apparatus is used that transfers a pattern formed on a mask or a reticle (hereinafter generally referred to as a "reticle") onto a substrate on which a resist or the like is coated, e.g. a photosensitive object such as a wafer or a glass plate (hereinafter generally referred to as a "wafer"), via a projection optical system.

Semiconductor devices and the like are made by overlaying multiple layers of patterns on the wafer. Therefore, in the exposure apparatus, an operation (alignment) is required for making an optimal positional relation between a pattern formed on the wafer and the pattern formed on the reticle. As the alignment method, the EGA (Enhanced Global Alignment) method is mainly used. In the EGA method, a plurality of specific shot areas (also called sample shot areas or alignment shot areas) is selected in advance, and positional information of alignment marks (sample marks) arranged in the sample shot areas is sequentially measured. Then, static calculation is performed with a least squares method or the like using the measurement results and the designed arrangement information of the shot area, and the arrangement coordinates of the shot areas on the wafer are obtained. Therefore, in the EGA method, the arrangement coordinates of each shot area can be obtained with high precision and high throughput (for example, refer to Kokai (Japanese Patent Unexamined Application Publication) No. 61-44429).

In the above alignment, in order to measure the alignment marks arranged in the plurality of sample shot areas, the wafer has to be moved along a path in which the plurality of alignment marks can be sequentially positioned in a detection area of a mark detection system (an alignment detection system). Conventionally, wafer alignment operation (the measurement operation of sample marks) was performed prior to the beginning of exposure of the wafer, therefore, when the number of sample shots increases more time has to be put into the measurement, which meant that the throughput of the exposure apparatus could decrease.

Therefore, recently, a stage unit by the so-called twin stage method has been developed in which the throughput of the entire apparatus is improved by executing a parallel processing where two wafer stages are prepared and while exposure is performed on one wafer stage, alignment is performed on the other wafer stage, and is employed in the exposure apparatus. However, because the twin stage is costly, requirements are pressing for a technology that can suppress the decrease in throughput caused by the alignment operation without using the twin stage.

SUMMARY OF THE INVENTION

The present invention was made under the above situation, and according to a first aspect of the present invention, there is provided a first pattern forming method of forming a pattern on an object, the method comprising: a first process of detecting a mark while the object is being moved, with at least a part of a mark detection system also being moved; and a second process of forming a pattern on the object using detection results of the mark.

According to this method, the mark on the object is detected while the object is being moved, with at least a part of the mark detection system also being moved. Accordingly, it becomes possible to improve the throughput of the entire process including the first process and the second process.

In this case, the detection of the mark can be performed while the moving section moves at least from a loading position where object is held by the moving section to a position where pattern forming with respect to the object begins, or the detection of the mark can be performed at least after the beginning of pattern forming with respect to the object.

According to a second aspect of the present invention, there is provided a second pattern forming method of forming a pattern on an object, the method comprising: a first process of detecting a mark on the object while the object is being moved, with a detection area of a mark detection system also being moved; and a second process of forming a pattern on the object using detection results of the mark.

According to this method, the mark on the object is detected while the object is being moved, with the detection area of the mark detection system also being moved, therefore, by performing mark detection while the object is being moved, the time required for detection of the mark can be reduced, which makes it possible to improve the throughput of the entire process.

According to a third aspect of the present invention, there is provided a third pattern forming method of forming a pattern on an object wherein a mark on the object is detected by a mark detection system, and pattern forming with respect to the object begins using the detection results, whereby a mark on the object is detected by the mark detection system even after the beginning of pattern forming, and the detection results are used in the pattern forming.

According to this method, the mark on the object is detected even after the beginning of pattern forming with respect to the object using the detection results of the mark on the object in parallel with the pattern forming, and the detection results are used in the pattern forming, therefore, it becomes possible to increase the number of the marks to be detected while maintaining the throughput. This makes it possible to achieve pattern forming with high precision while maintaining the throughput.

According to a fourth aspect of the present invention, there is provided a fourth pattern forming method of forming a pattern on an object wherein the object is moved in a first direction, and a plurality of marks that have different positions in the first direction on the object are each detected by a plurality of mark detection systems that have detection areas of different positions in the first direction and a second direction orthogonal to the first direction, and information related to the surface shape of the object is also detected by a detection system different from the mark detection system, whereby a pattern is formed on the object using the two detection results.

According to this method, each of the plurality of mark detection systems that have detection areas of different positions in the first direction and a second direction orthogonal to the first direction detect the plurality of marks that have different positions in the first direction on the object, which allows the time required for detection of the mark to be reduced. Further, because a pattern is formed on the object using the detection results of the mark and the information related to the surface shape of the object, pattern forming with high precision can be achieved.

According to a fifth aspect of the present invention, there is provided a first pattern forming apparatus that forms a pattern on an object held by a moving section, the apparatus comprising: a mark detection system that can have at least a part of the system moved; and a control unit that moves at least a part of the mark detection system so as to detect a mark on the object with the mark detection system while the moving section is being moved.

According to this apparatus, while the moving section is being moved, the control unit moves at least a part of the mark detection system and detects the mark on the object with the mark detection system. Accordingly, it becomes possible to improve the throughput of the entire process.

In this case, the control unit can control a movement of at least a part of the mark detection system so that detection of the mark is performed while the moving section is being moved at least from a loading position where the moving section holds the object to a position where pattern forming with respect to the object begins, or the control unit can control a movement of at least a part of the mark detection system so that detection of the mark is performed at least after pattern forming has begun on the object.

According to a sixth aspect of the present invention, there is provided a second pattern forming apparatus that forms a pattern on an object held by a moving section, the apparatus comprising: a mark detection system that can have at least a part of the system moved; and a control unit that controls a movement of a detection area of the mark detection system so as to detect a mark on the object with the mark detection system while the moving section is being moved.

According to this apparatus, the control unit moves the detection area of the mark detection system while the moving section is being moved and detects the mark on the object with the mark detection system, therefore, by performing mark detection while the moving section is being moved, the time required for detection of the mark can be reduced, which accordingly, makes it possible to improve the throughput of the entire process.

According to a seventh aspect of the present invention, there is provided a third pattern forming apparatus that forms a pattern on an object held by a moving section, the apparatus comprising: a mark detection system that detects a mark on the object; and a control unit that controls detection of the mark on the object using the mark detection system and pattern forming with respect to the object, wherein the control unit detects the mark on the object with the mark detection system and begins pattern forming with respect to the object using the detection results, and after the beginning of pattern forming, continues to detect the mark on the object with the mark detection system and uses the detection results in the pattern forming.

According to this apparatus, the control unit detects the mark on the object even after the beginning of pattern forming with respect to the object using the detection results of the mark on the object in parallel with the pattern forming, and performs pattern forming using the detection results, therefore, it becomes possible to increase the number of the marks to be detected while maintaining the throughput. This makes it possible to achieve pattern forming with high precision while maintaining the throughput.

According to an eighth aspect of the present invention, there is provided a fourth pattern forming apparatus that forms a pattern on an object held by a moving section, the apparatus comprising: a plurality of mark detection systems that have detection areas of different positions in a second direction orthogonal to a first direction; a detection unit that detects information related to the surface shape of the object: and a control unit that detects a plurality of marks whose position is different in the first direction on the object using each of the plurality of mark detection systems and also detects information related to the surface shape of the object using the detection unit, and forms a pattern on the object using the two detection results while moving the moving section in the first direction.

According to this apparatus, the control unit detects the plurality of marks that have different positions in the first direction on the object, using each of the plurality of mark detection systems that have detection areas of different positions in the first direction and a second direction orthogonal to the first direction while moving the moving section in the first direction, therefore, the time required for detection of the marks can be reduced. Further, because a pattern is formed on the object using the detection results of the mark and the information related to the shape of the object, pattern forming with high precision can be achieved.

Further, by transferring a pattern on a sensitive object using any one of the first to fourth pattern forming method and/or any one of the first to fourth pattern forming apparatus of the present invention, the productivity of highly integrated microdevices can be improved. Accordingly, further from another aspect, it can be said that the present invention is also a device manufacturing method including a pattern transfer process on a sensitive object that uses any one of the first to fourth pattern forming method and/or any one of the first to fourth pattern forming apparatus of the present invention.

BRIEF DESCRIPTION OF THE DRAWINGS

In the accompanying drawings.

DESCRIPTION OF THE EMBODIMENTS

A First Embodiment

Hereinafter, a first embodiment of the present invention will be described, referring to FIGS. 1 to 11.

Figure 1:
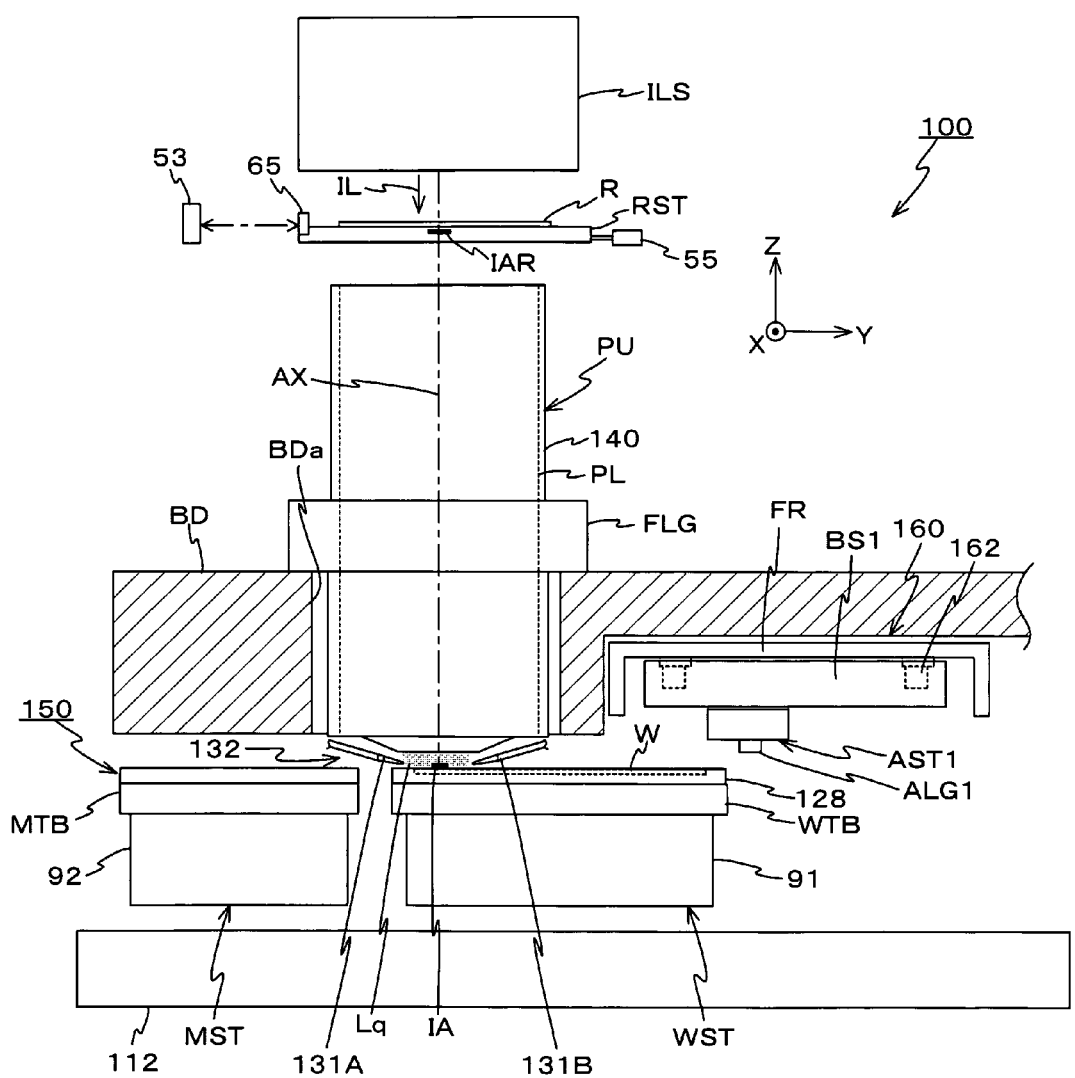
FIG. 1 is a view that shows a schematic configuration of an exposure apparatus related to a first embodiment.

FIG. 1 shows an entire view of an arrangement of an exposure apparatus 100 related to the first embodiment.

Exposure apparatus 100 is a scanning exposure apparatus based on a step-and-scan method, that is, the so-called scanner.

Exposure apparatus 100 is equipped with an illumination system ILS that irradiates an exposure illumination light (hereinafter referred to as illumination light or exposure light) IL on an illumination area IAR on a reticle R, a reticle stage RST that holds reticle R, a projection unit PU including a projection optical system PL that projects illumination light IL emitted form reticle R on a wafer W, a stage unit 150 including a wafer stage WST on which wafer W is mounted and a measurement stage MST used in measurement for exposure, alignment systems ALG1 and ALG2 (refer to FIG. 3 for alignment system ALG2), a drive unit (hereinafter called an alignment system stage unit) 160 serving as an actuator for moving alignment systems ALG1 and ALG2 within a two-dimensional plane (an XY plane), a main controller 50 (not shown in FIG. 1, refer to FIG. 6) serving as a control system that has overall control over the operation of the entire exposure apparatus and the like. In the description below, the Z-axis will be set along a direction parallel to an optical axis AX of projection optical system PL (a vertical direction within the page surface of FIG. 1), the Y-axis will be set along a predetermined scanning direction (a lateral direction within the page surface of FIG. 1) in which reticle R and wafer W are synchronously moved during scanning exposure within a plane perpendicular to the Z-axis, and the X-axis will be set along a non-scanning direction (a direction perpendicular to the page surface of FIG. 1) orthogonal to the scanning direction.

Further, the rotational (gradient) direction around the X-axis, Y-axis, and Z-axis will be set as θx direction, θy direction, and θz direction, respectively.

Further, exposure apparatus 100 is a liquid immersion exposure apparatus that exposes wafer W with illumination light IL via projection optical system PL and a liquid Lq. In the embodiment, the apparatus employs a local liquid immersion method in which liquid Lq is filled in a liquid immersion space including the optical path of illumination light IL between an optical member that has wafer W placed opposing the optical member and also emits illumination light IL, that is, an optical element (hereinafter also referred to as an end optical element or the lowest optical element) placed closest to the image plane of projection optical system PL and wafer W, and is equipped with a liquid immersion unit 132 that has at least a part of the unit (e.g. a nozzle unit or the like) arranged in a body BD. Liquid immersion unit 132 includes a liquid supply unit 138 that supplies liquid Lq to the liquid immersion space via a nozzle unit and a liquid recovery unit 139 that recovers liquid Lq from the liquid immersion space via a nozzle unit (neither of them are shown in FIG. 1, refer to FIG. 6), and operates under the control of main controller 50. The nozzle unit could be a ring shaped member that surrounds the lower end section of projection optical system PL and has a liquid flow passage inside, however, in the embodiment, the nozzle unit will be configured by a liquid supply nozzle 131A and a liquid recovery nozzle 131B.

In the plurality of shot areas disposed in a matrix on wafer W, a pattern is formed in each area, and also in each shot area an alignment mark is formed in a predetermined positional relation with the pattern. In the embodiment, the alignment mark is a two-dimensional mark. For example, the alignment mark includes two one-dimensional patterns that are periodically disposed in the X-axis and Y-axis directions, respectively, and is formed on a street line (a scribe line) that divides the plurality of shot areas on wafer W. Further, arrangement information of the shot areas (including the alignment marks) on wafer W is stored in a memory of main controller 50 as a shot map data. In the embodiment, the EGA method described earlier is employed, therefore, of the plurality of shot areas on wafer W, information related to the position, number and the like of the shot areas that have the alignment marks which are to be detected (alignment shot data) is already input into main controller 50. Further, wafer W on wafer stage WST has orthogonal street lines, which substantially coincide with the X-axis and Y-axis directions, respectively, and on the surface of wafer W a photosensitive layer (a photoresist layer) is formed. In the embodiment, a photosensitive material that is liquid repellent can be used, or a protective topcoat film can be formed on the photosensitive layer.

Illumination system ILS includes a light source and an illumination optical system. As the light source, for instance, an ArF excimer laser light source (output wavelength: 193 nm) is used. Further, the illumination optical system includes a beam shaping optical system, a rough energy adjuster, an optical integrator (a uniformizer, or a homogenizer), an illumination system aperture stop plate, a beam splitter, a relay lens, a reticle blind, a mirror for bending the optical path, a condenser (none are shown) and the like, which are placed in a predetermined positional relation. Details on the arrangement of illumination system ILS and the function of each optical member are disclosed in, for example, the pamphlet of International Publication WO2002/103766 (and the corresponding U.S. Patent Application Publication 2003/0098959) and the like.

On reticle stage RST, reticle R on which a circuit pattern or the like is formed on the pattern surface (the lower surface in FIG. 1) is fixed, for example, by vacuum suction. Reticle stage RST can be finely driven at least within an XY plane by a reticle stage drive system 55 that includes, for example, a linear motor or the like, and can also be driven at a designated scanning speed in the scanning direction (in the Y-axis direction).

Positional information of reticle stage RST (including the positional information of at least the X-axis direction, the Y-axis direction, and the θz direction) is constantly detected by a reticle laser interferometer (hereinafter referred to as "reticle interferometer") 53 via a movable mirror 65 (a Y movable mirror that has a reflection surface orthogonal to the Y-axis direction and an X movable mirror that has a reflection surface orthogonal to the X-axis direction are actually arranged) at a resolution of, for example, around 0.5 to 1 nm. The measurement values of reticle interferometer 53 is sent to main controller 50, and based on the measurement values of reticle interferometer 53, main controller 50 controls the position (and speed) of reticle stage RST via stage reticle drive system 55. Movable mirror 65 is not limited to a planar mirror and can include a corner cubic mirror (a retroreflector), or instead of fixing movable mirror 65 on reticle stage RST, a reflection surface can be used, for example, which is formed by mirror polishing the edge surface (side surface) of reticle stage RST.

Projection unit PU is arranged below reticle stage RST in FIG. 1, and is inserted into an opening BDa formed in a body (including, for example, a holding mechanism that supports a base member with three or four struts in which vibration isolation units are arranged, respectively) BD placed on a floor surface (or a base plate), and is supported by body BD via a flange FLG. Projection unit PU is configured including a barrel 140, and projection optical system PL consisting of a plurality of optical elements held in a predetermined positional relation within barrel 140. As projection optical system PL, a dioptric system is used, consisting of a plurality of lenses (lens elements) disposed along optical axis AX. Projection optical system PL is, for example, a both-side telecentric dioptric system that has a predetermined projection magnification (such as one-quarter, one-fifth, or one-eighth times) is used. Therefore, when illumination light IL from illumination system ILS illuminates illumination area IAR on reticle R, a reduced image of the circuit pattern of reticle R within illumination area IAR (a partial reduced image of the circuit pattern) is formed on wafer W whose surface is coated with a resist on an area (hereinafter also referred to as an "exposure area" or a "projection area") IA conjugate with illumination area IAR by illumination light IL that has passed through reticle R, via projection unit PU (projection optical system PL). In the embodiment, projection unit PU is installed in body BD, however, as is disclosed in, for example, the pamphlet of International Publication WO2006/038952, projection unit PU can be supported by suspension with respect to a mainframe placed above body BD (the +Z side) in FIG. 1.

Further, in exposure apparatus 100 of the embodiment, at least during scanning exposure, liquid immersion unit 132 locally forms a liquid immersion area larger than exposure area IA but smaller than wafer W on a part of wafer W including exposure area IA on which illumination light IL is irradiated via projection PU. In the vicinity of the lower end of projection unit PU, a nozzle unit that constitutes a part of liquid immersion unit 132, that is, liquid supply nozzle 131A and liquid recovery nozzle 131B, is arranged.

Figure 6:
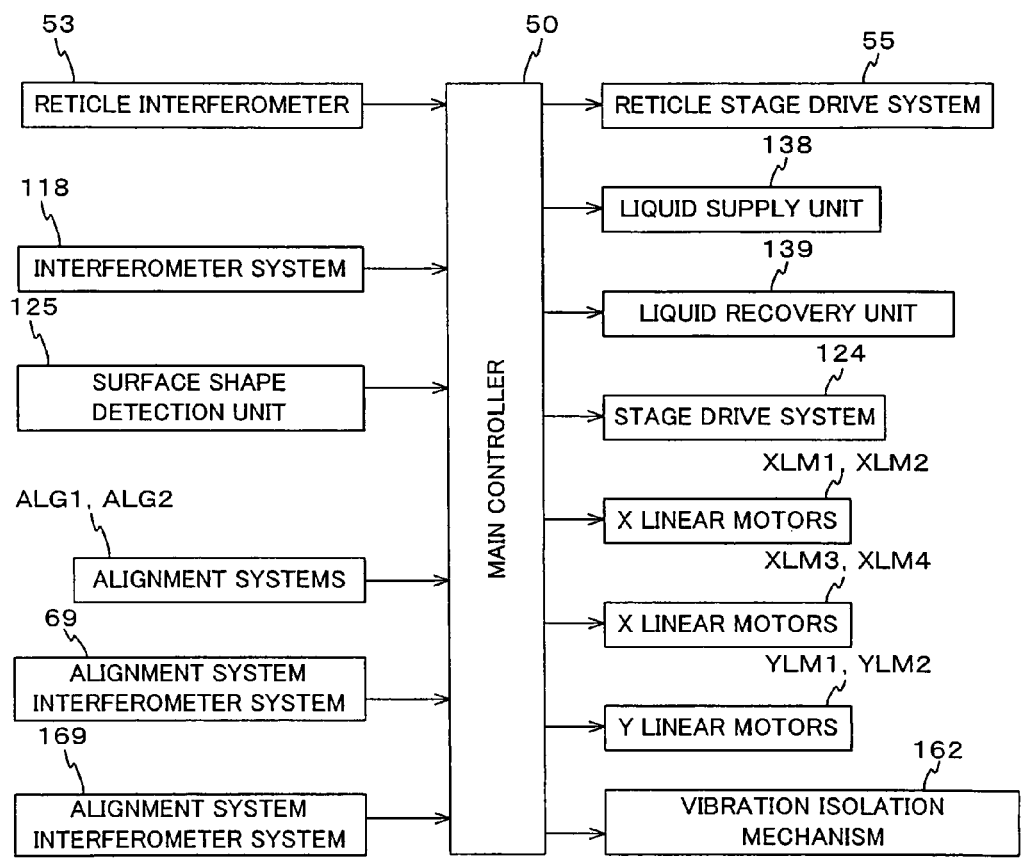
FIG. 6 is a block diagram that shows a control system of an exposure apparatus related to the first embodiment.

Liquid supply nozzle 131A connects to the other end of a supply pipe (not shown) that has one end connected to liquid supply unit 138 (refer to FIG. 6). Further, liquid recovery nozzle 131B connects to the other end of a recovery pipe (not shown) that has one end connected to liquid recovery unit 139 (refer to FIG. 6).

Main controller 50 supplies liquid Lq (e.g. pure water) to the space in between the lowest optical element (such as a lens) of projection optical system PL and wafer W via liquid supply nozzle 131A and also recovers liquid Lq via liquid recovery nozzle 131B. In this case, main controller 50 controls liquid supply unit 138 and liquid recovery unit 139 so that the amount of liquid Lq supplied from liquid supply nozzle 131A and the amount of liquid Lq recovered via liquid supply nozzle 131B is constantly equal. Accordingly, a constant amount of liquid Lq (refer to FIG. 1) is held on wafer W. In this case, liquid Lq held on wafer W is constantly replaced.

In the case when measurement stage MST is also positioned below projection unit PU, liquid Lq can be filled in the space between measurement table MTB and projection unit PU as is described above, that is, a liquid immersion area can be formed. Further, in the embodiment, at least the nozzle unit of liquid immersion unit 132 was arranged in body unit BD, however, in the case exposure apparatus 100 supports projection unit PU by suspension with respect to the mainframe as is previously described, for example, the nozzle unit can be arranged independently from projection unit PU, in a frame supported by suspension from the mainframe.

Figure 2:
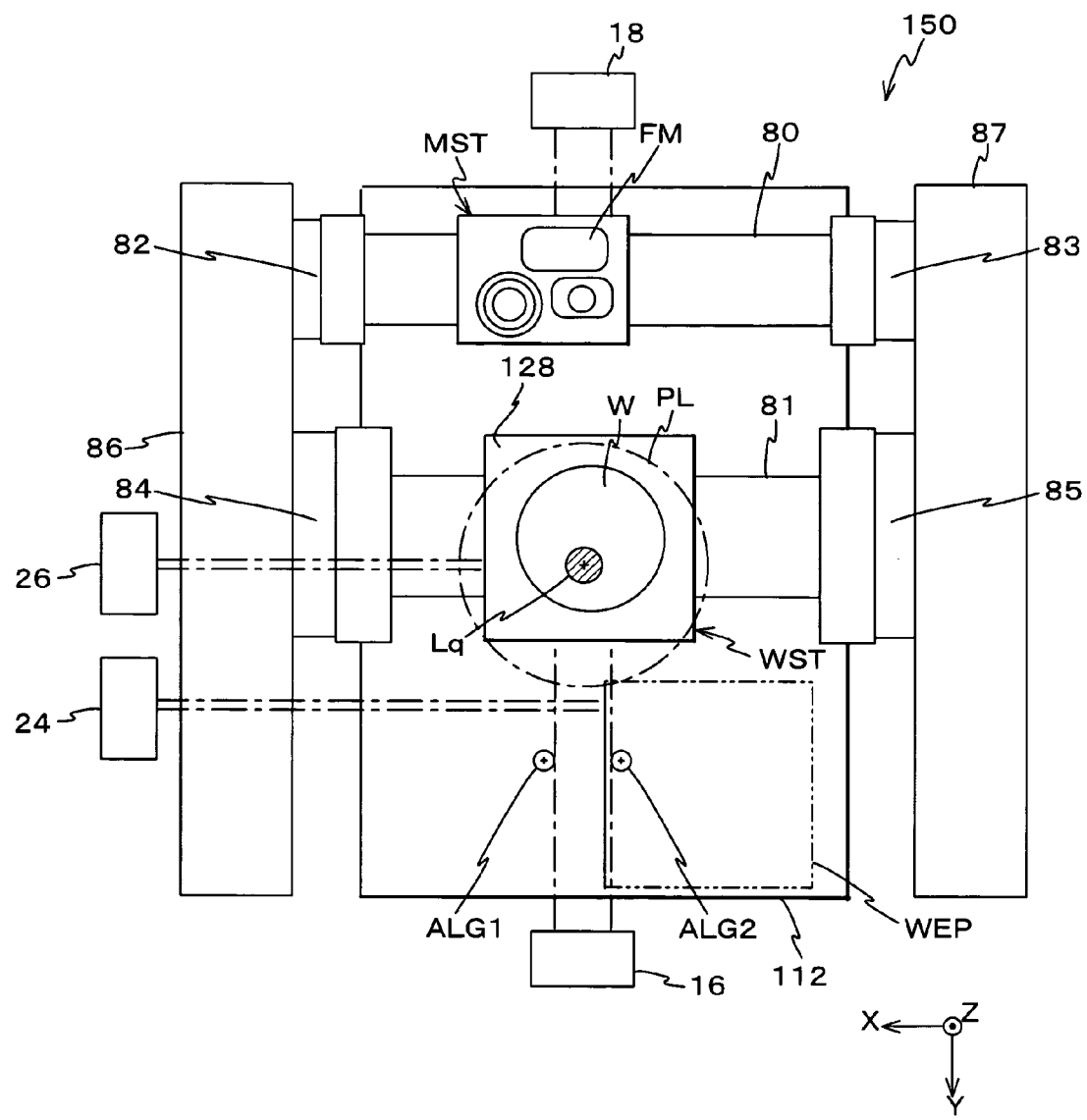
FIG. 2 is a planar view that shows a stage unit in FIG. 1.

As is shown in FIG. 1 and in FIG. 2, which is a planar view of stage unit 150, stage unit 150 includes wafer stage WST placed on a base panel 112 and measurement stage MST that has a measurement member (a fiducial mark, a sensor and the like) like the ones disclosed in, for example, Kokai (Japanese Patent Unexamined Application Publication) No. 11-135400 (and the corresponding pamphlet of International Publication WO1999/23692), Kokai (Japanese Patent Unexamined Application Publication) No. 2000-164504 (and the corresponding U.S. Pat. No. 6,897,963) and the like, an interferometer system 118 (refer to FIG. 6) for measuring the position (positional information) of stages WST (wafer W) and MST, and a stage drive system 124 (refer to FIG. 6) that drives stages WST and MST. Although it is not shown in the drawings, base panel 112 is placed on the floor surface (or on a base plate) via, for example, four vibration isolation units.

On the bottom surface of wafer stage WST and measurement stage MST, non-contact bearings (not shown) such as for example, air bearings (also called air pads) are arranged in a plurality of areas, and by the air bearings, wafer stage WST and measurement stage MST are supported above the upper surface of base panel 112 via a clearance of around several μm. Further, each of the stages WST and MST are driven (including the θz rotation) independently within the XY plane by stage drive system 124.

More specifically, as is shown in FIG. 1, wafer stage WST includes a wafer stage main section 91 that has the air bearings described above arranged on its bottom surface, and a wafer table WTB which is mounted on wafer stage main section 91 via a Z-tilt mechanism (not shown) (configured including an actuator such as, for example, a voice coil motor) and moves finely with respect to wafer stage main section 91 in the Z-axis direction, the θx direction, and the θy direction.

On wafer table WTB, an auxiliary plate (liquid repellent plate) 128 that is substantially rectangular and has a circular opening formed in the center whose inner diameter is slightly larger than wafer W is arranged. Further, inside the circular opening, a wafer holder (not shown) that holds wafer W by vacuum suction or the like is arranged. Auxiliary plate 128 has a surface (liquid repellent surface) on which liquid repellent treatment is applied against liquid Lq, and the surface is set substantially flush with wafer W held by suction on the wafer holder. Auxiliary plate 128 is made of a material that has a low-thermal expansion rate such as, for example, glass or ceramics (Zerodur of Schott Corporation (brand name), $Al_2O_3$, TiC or the like), and on the surface, a liquid repellent film is made of materials such as, for example, a fluorinated resin material as in fluorine resin material, polytetrafluoroethylene (Teflon (brand name)) or the like, an acrylic resin material, a silicon resin material or the like.

Measurement stage MST includes a measurement stage main section 92 that has the air bearings described above arranged on its bottom surface, and a measurement table MTB mounted on measurement stage main section 92 via Z-tilt mechanism (not shown).

Various measurement members are arranged with measurement table MTB (and measurement stage main section 92). These measurement members include a fiducial mark member FM on which a plurality of fiducial marks is formed whose details are disclosed in, for example, Kokai (Japanese Patent Unexamined Application Publication) No. 5-21314 (and the corresponding U.S. Pat. No. 5,243,195) and the like, a sensor that receives illumination light IL via projection optical system PL and the like. In the embodiment, as the sensor, at least one of an illumination monitor whose details are disclosed in, for example, Kokai (Japanese Unexamined Patent Application Publication) No. 11-16816 (the corresponding U.S. Patent Application Publication No. 2002/0061469), an uneven illuminance measuring sensor whose details are disclosed in, for example, Kokai (Japanese Unexamined Patent Application Publication) No. 57-117238 (the corresponding U.S. Pat. No. 4,465,368), or an aerial image measuring instrument whose details are disclosed in, for example, Kokai (Japanese Unexamined Patent Application Publication) No. 2002-14005 (the corresponding U.S. Patent Application Publication No. 2002/0041377), and a wavefront aberration measuring instrument by the Shack-Hartmann method whose details are disclosed in, for example, the pamphlet of International Publication WO2003/065428 and the like is employed.

In the embodiment, according to the liquid immersion exposure performed in which wafer W is exposed by illumination light IL via projection optical system PL and liquid Lq, the above sensor used in the measurement that uses illumination light IL is to receive illumination light IL via projection optical system PL and liquid Lq. Further, apart of the sensor such as the optical system can be installed in measurement table MTB (and measurement stage main section 92), or the entire sensor can be arranged with measurement table MTB (and measurement stage main section 92). In the embodiment, the surface of measurement table MTB (the measurement members referred to earlier can also be included) is also covered with a liquid repellent film (water repellent film).

Next, stage drive system 124 will be described. As is shown in the planar view in FIG. 2, on the +X side and −X side of base panel 112, a pair of Y-axis stators 86 and 87 extending in the Y-axis direction is placed, respectively. Stators 86 and 87 are configured by armature units that have a plurality of coils inside. To Y-axis stators 86 and 87, a pair of Y-axis movers 82 and 83, which are respectively arranged on both ends in the longitudinal direction of an X-axis stator 80 extending in the X-axis direction, is engaged. Further, to Y-axis stators 86 and 87, a pair of Y-axis movers 84 and 85, which are respectively arranged on both ends in the longitudinal direction of an X-axis stator 81 extending in the X-axis direction, is engaged. Y-axis movers 82, 84, 83, and 85 are each configured by a magnetic pole unit that has a plurality of permanent magnets.

More specifically, Y-axis stator 86 and Y-axis mover 82, Y-axis stator 87 and Y-axis mover 83, Y-axis stator 86 and Y-axis mover 84, and Y-axis stator 87 and Y-axis mover 85 respectively constitute four moving magnet type Y-axis linear motors the that drive Y-axis movers 82 to 85 in the Y-axis direction. In the description below, the above four Y-axis linear motors will appropriately referred to as Y-axis linear motors 82 to 85, using the same reference numerals as Y-axis movers 82 to 85. As the Y-axis linear motor, a moving coil type linear motor can also be employed.

Of the above four Y-axis linear motors, the two Y-axis linear motors 82 and 83 drive measurement stage MST in the Y-axis direction integrally with X-axis stator 80, and the two remaining Y-axis linear motors 84 and 85 drive wafer stage WST in the Y-axis direction integrally with X-axis stator 81. Further, stages MST and WST are each finely driven by two Y-axis linear motors in the θz direction.

X-axis stators 80 and 81 are each configured, for example, by an armature unit that incorporates armature coils, which are placed along the X-axis direction at a predetermined interval. X-axis stator 81 is inserted into an opening (not shown) formed in wafer stage main section 91 (refer to FIG. 1) that constitutes wafer stage WST. Inside the above opening of wafer stage main section 91, for example, an X-axis mover (not shown) consisting of a magnetic pole unit is arranged. That is, X-axis stator 81 and the X-axis mover constitute a moving magnet type X-axis linear motor that drives wafer stage WST in the X-axis direction. Hereinafter, the X-axis linear motor will be appropriately referred to as X-axis linear motor 81, using the same reference numeral as its stator, X-axis stator 81.

Further, X-axis stator 80 is inserted into an opening (not shown) formed in measurement stage main section 92 (refer to FIG. 1) that constitutes measurement stage MST. Inside the above opening of measurement stage main section 92, for example, an X-axis mover (not shown) consisting of a magnetic pole unit is arranged. That is, X-axis stator 80 and the X-axis mover constitute a moving magnet type X-axis linear motor that drives measurement stage MST in the X-axis direction. Hereinafter, the X-axis linear motor will be appropriately referred to as X-axis linear motor 80, using the same reference numeral as its stator, X-axis stator 80. As X-axis linear motors 80 and 81, a moving coil type linear motor can also be employed.

In the embodiment, Y-axis linear motors 82 to 85, X-axis linear motors 80 and 81, and the Z-tilt mechanism in both wafer stage WST and measurement stage MST constitute stage drive system 124 shown in FIG. 6. Each of the above linear motors that constitute stage drive system 124 operates under the control of main controller 20 shown in FIG. 6. In the embodiment, on the opposite side (+Y side) of measurement stage MST with respect to projection optical system PL, a loading position WEP is set to which wafer W is carried by a carrier unit (wafer loader) (not shown). Wafer stage WST moves to loading position WEP, and then after wafer W is mounted on wafer stage WST, moves toward the position directly under projection optical system PL (the exposure area previously described). Then, after exposure treatment of wafer W has been completed, wafer stage WST moves to an unloading position (in the embodiment, the unloading position is to be at the same position as the loading position) and unloads wafer W that has been exposed, and also loads the wafer (wafer exchange) on which exposure treatment is to be performed next.

The positional information of wafer stage WST (wafer W) and measurement stage MST is detected at all times by interferometer system 118 in FIG. 6 via the side surface (a reflection surface that has been mirror polished) of wafer table WTB and measurement table MTB, at a resolution, for example, around 0.5 to 1 nm. Interferometer system 118 includes a Y interferometer 16 for detecting the position of wafer stage WST in the Y-axis direction (including the position in the θz direction), a Y interferometer 18 for detecting the position of measurement stage MST in the Y-axis direction (including the position in the θz direction), X interferometers 24 and 26 for detecting the position of each stage in the X-axis direction as is shown in FIG. 2, a Z interferometer (not shown) for detecting the position of wafer table WTB in the Z-axis direction (including the position in the θx direction and the θy direction) and the like. The measurement values of interferometer system 118 are sent to main controller 50, and based on the measurement values of interferometer system 118, main controller 50 controls the position and the like of each of the stages WST and MST (and each of the tables WTB and MTB) via stage drive system 124. Instead of mirror polishing the side surface of each table, movable mirrors can be arranged on each table. Further, along with or instead of the interferometer system, the position of each of the stages can be detected, for example, using a linear encoder or the like.

Furthermore, in exposure apparatus 100 of the embodiment, alignment systems ALG1 and ALG2 by the off-axis method are arranged that respectively have a detection area whose position is independently variable within a predetermined surface (XY plane) perpendicular to optical axis AX of projection optical system PL, between the loading position WEP and the exposure starting position of wafer W. In order to make the detection area move within the above predetermined surface, at least a part of alignment systems ALG1 and ALG2, such as for example, a part of the system (including an objective optical system, a photodetection element and the like) excluding the light source, is movable by alignment system stage unit 160. Accordingly, by moving a part of alignment systems ALG1 and ALG2 during the movement of wafer stage WST, the detection area moves in a predetermined positional relation with the marks on wafer stage WST (alignment marks or the like of wafer W), and detection of the marks become possible during the movement of wafer stage WST.

In the embodiment, because alignment systems ALG1 and ALG2 employ the image processing method, a part of the alignment systems ALG1 and ALG2 are moved so that the marks do not move away from the detection area during the movement of wafer stage WST. Therefore, it is preferable to move a part of the alignment systems ALG1 and ALG2 so that the relative speed between the marks and the detection area is almost zero at least during a predetermined time while the mark detection (imaging) is being performed. Further, in the embodiment, while wafer stage WST moves from loading position WEP previously described to the exposure starting position of wafer W, detection of a plurality of alignment marks on wafer W is performed by alignment systems ALG1 and ALG2, and the positional information of the plurality of marks that have been detected is used when scanning exposure of all M shot areas or a part of ($1 \leqq n \leqq$ an integer of M−1) the M shot areas that is to be exposed on wafer W is performed. In this case, the exposure starting position of wafer W in the embodiment is the position of wafer W (wafer stage WST) when the first shot area that is to be exposed on wafer W is set at the scanning starting position (acceleration starting position). Furthermore, in the embodiment, mark detection by at least one of alignment systems ALG1 and ALG2 is performed even after the exposure of wafer W (the first shot area) has begun, and the positional information of the marks that have been detected is used for performing scanning exposure of all or a part of the shot areas from the second shot onward.

Further, in exposure apparatus 100 of the embodiment, a surface shape detection unit 125 (refer to FIG. 6) can be equipped in body BD that holds projection unit PU. Surface shape detection unit 125 includes, for example, an irradiation system that obliquely irradiates a linear beam longer than the diameter of wafer W on wafer W, and a photodetection system that has a detector, which receives the reflection light of the beams irradiated by the irradiation system, such as for example, a one-dimensional CCD sensor, a line sensor or the like. In this case, the linear beam irradiated from the irradiation system is a beam formed by a plurality of spot-shaped (or slit-shaped) laser beams lined apart in the X-axis direction between, for example, the loading position WEP and the exposure starting position, and the irradiation area is actually a concentration of an irradiation area of a plurality of spot-shaped beams. Accordingly, in the same principle as the detection principle of the known multiple point AF system, with the plurality of spot-shaped irradiation areas serving as the measurement points, the Z position (positional information related to the Z-axis direction perpendicular to the predetermined surface (the XY plane) in which wafer W moves) of wafer W at each measurement point can be detected. And, based on the measurement results, main controller 50 can detect information related to the shape of the surface of wafer W subject to exposure.

Accordingly, before the beginning of exposure (for example, during the movement from loading position WEP to the exposure starting position), wafer W is relatively moved with respect to the irradiation area of surface shape detection unit 125, and main controller 50 computes the distribution of the Z positional information of the wafer surface, based on the measurement values (the position of the wafer) by interferometer system 118 and the detection results of surface shape detection unit 125. Then, on exposure operation, main controller 50 controls the position in the Z-axis direction and the attitude of wafer table WTB, based on the computation results. In the embodiment, at least a part of the detection operation of the Z positional information of the wafer by surface shape detection unit 125 is performed in parallel with the mark detection operation (to be described later) by alignment systems ALG1 and ALG2, therefore, it becomes possible to suppress a decrease in throughput due to detecting the Z positional information before the beginning of exposure. The irradiation area of surface shape detection unit 125, for example, is preferably placed substantially parallel to the X-axis direction, between exposure area IA (liquid immersion area of liquid Lq) and the detection area of alignment system ALG1 and ALG2 in the Y-axis direction. In this case, because the detection operation of the Z positional information is performed while wafer stage WST is being moved from loading position WEP to the exposure starting position, both the exposure accuracy and the throughput can be improved. Further, in the case exposure apparatus 100 employs the configuration of supporting projection unit PU by suspension with respect to the mainframe, at least a part of surface shape detection unit 125 can be arranged, for example, in a measurement frame supported by suspension independently from the mainframe.

As is shown in FIG. 1, alignment system stage unit 160 includes a frame FR arranged separately from body BD vibrationwise, base platforms BS1 and BS2 (base platform BS2 not shown in FIG. 1, refer to FIG. 3) arranged on the lower surface side of frame FR, and alignment system stages AST1 and AST2 (refer to FIG. 3 for alignment system stage AST2) that support alignment systems ALG1 and ALG2, which move in the X-axis and Y-axis directions, with the lower surface of base platforms BS1 and BS2 serving as a movement reference plane.

Although it is not shown in the drawings, frame FR is supported in the four corners by four supporting columns set placed on the floor surface (or the base plate or the like). Frame FR consists of a member that has an inverted U-shaped YZ section, and on the +Y side end section and the −Y side end section, stators of a linear motor that drives alignment system stages AST1 and AST2 are arranged.

Base platforms BS1 and BS2 each consist of a plate shaped member that has a lower surface (the surface on the −Z side) whose degree of flatness is extremely high, and are each supported by suspension from frame FR via a plurality of (e.g. three) vibration isolation mechanisms 162. These vibration isolation mechanisms 162 have, for example, a piston and a cylinder, and include a support unit that supports the self-weight of base platform BS1 (or BS2) using the pressure of gas inside a gas chamber formed between the piston and the cylinder, and a voice coil motor that drives the piston of the support unit.

Figure 3:
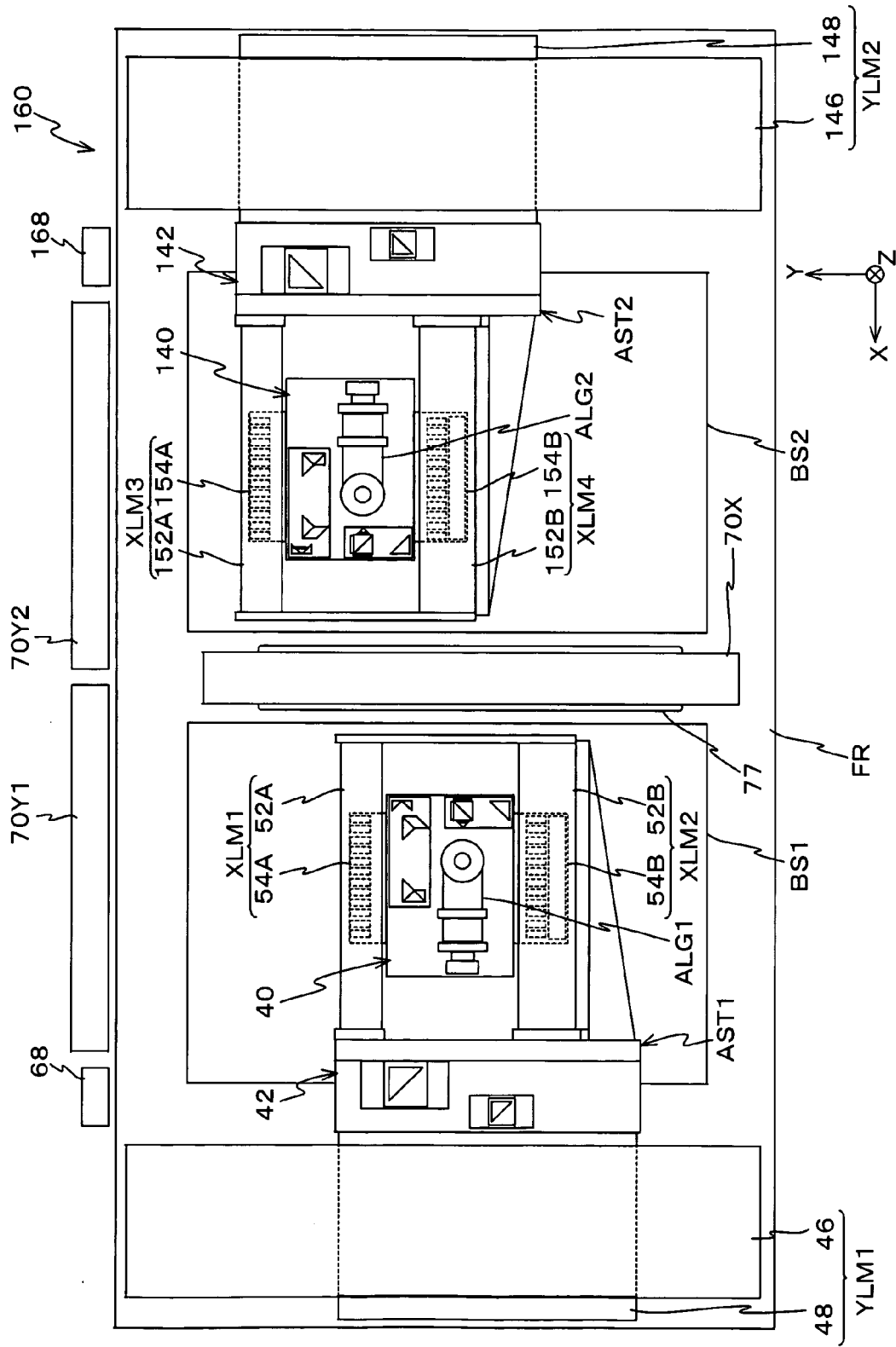
FIG. 3 is a view that shows a configuration of an alignment system stage unit.

As is shown in FIG. 3, alignment system stage AST1 includes a Y stage 42 that is movable in the Y-axis direction, and an X stage that is movable in the X-axis direction with respect to Y stage 42.

Y stage 42 has a rough trapezoidal shape in a planar view (when viewed from below), and is driven along the Y-axis by a Y linear motor YLM1 that includes a Y-axis stator 46 fixed to frame FR and a Y-axis mover 48 fixed to the +X side edge section of Y stage 42. X stage 40 is driven along the X-axis by a pair of X linear motors XLM1 and XLM2 that includes a pair of X-axis stators 52A and 52B whose longitudinal direction is in the X-axis direction, fixed to the lower surface (the −Z side surface) of Y stage 42, and a pair of X-axis movers 54A and 54B fixed to the end sections of X stage 40 on the +Y side and −Y side.

Inside one of the X linear motors, XLM2, a voice coil motor that makes X stage 40 activate a drive force in the Y-axis direction is also arranged, which makes it possible to finely drive X stage 40 in the Y-axis direction. Further, by slightly changing the drive force along the X-axis of X linear motors XLM1 and XLM2, it becomes possible to rotationally drive X stage 40 in the θz direction.

Alignment system ALG1 includes an optical system including an object lens and the like, an imaging device (such as a CCD) and the like. In the periphery of the CCD that constitutes a part of alignment system ALG1, a piping in which a liquid flows is arranged, and the CCD is liquid-cooled by the liquid that flows in the piping. Accordingly, the CCD can be placed close to the optical system including the object lens and the like, which makes it possible to reduce the size of alignment system ALG1. In this case, as for the light source of alignment system ALG1, instead of moving the light source with the alignment system stage, the light source is arranged external to the alignment system stage and is connected by an optical fiber or the like. The present invention, however, is not limited to this, and a relay optical system that includes a mirror or the like that transmits a beam from a light source externally arranged to the optical system of alignment system ALG1 can also be used. Alignment system ALG1 is not limited to the image processing method, and sensors of other various methods can also be used. For example, a sensor that detects diffracted light generated from an alignment mark on which a coherent laser beam is irradiated can also be used. Further, the cooling method of the CCD is not limited to liquid-cooling, and air-cooling can also be employed.

As is shown in FIG. 3, on the lower surface (−Z side surface) of Y stage 42 and X stage 40, various optical members that constitute an alignment system interferometer system 69 (shown only in FIG. 6) are placed. Interferometer system 69 of the embodiment employs the double-pass method, and measures the positional information in the X-axis and Y-axis directions and the rotational information in the θx, θy, and θz directions of alignment system stage AST1 (that is, alignment system ALG1).

Figure 4:
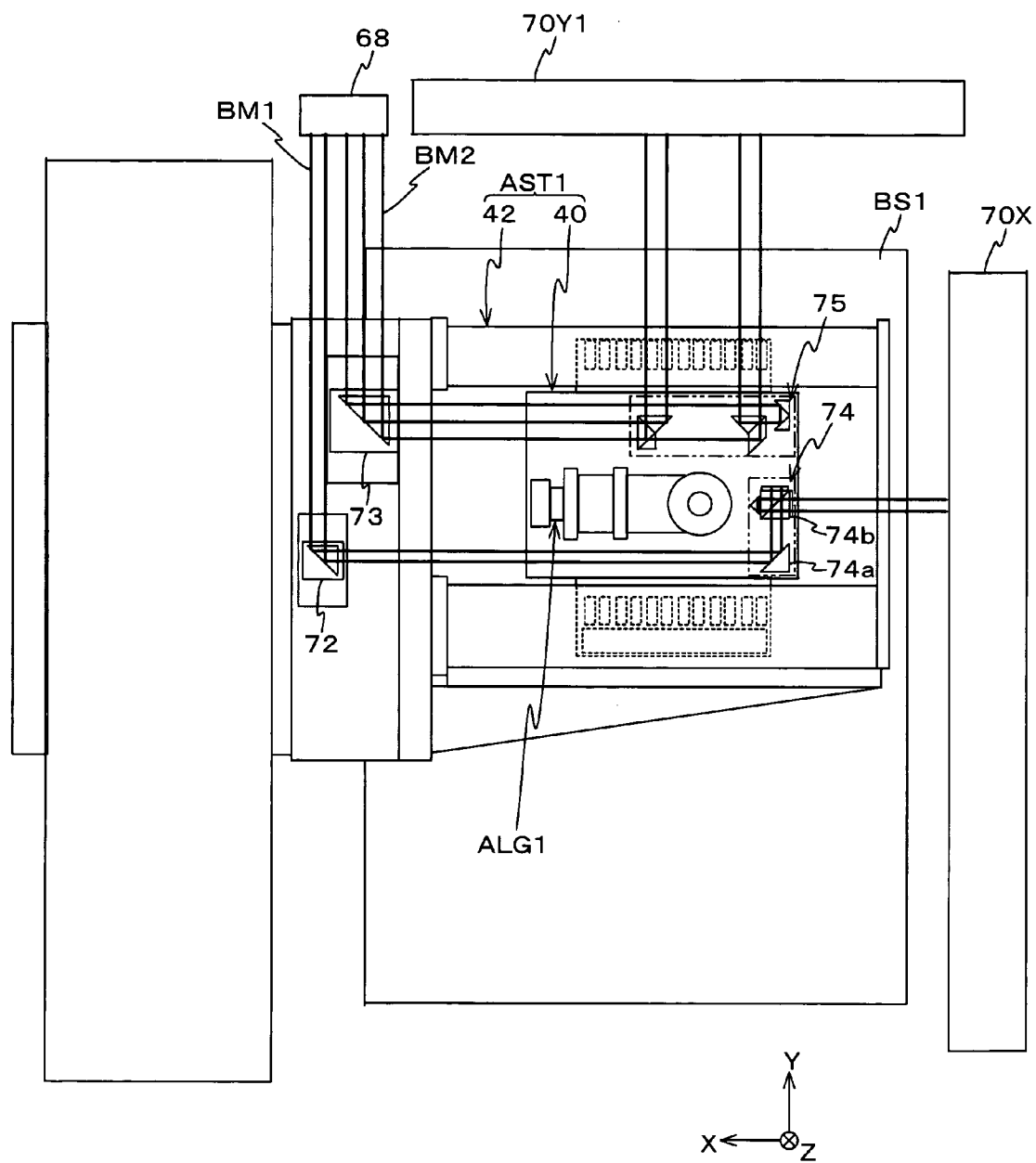
FIG. 4 is a view used for describing a configuration of an alignment system interferometer system.

Details on alignment system interferometer system 69 will be described below, referring to FIG. 4. Interferometer system 69 includes a sensor head section 68, a first bending mirror section 72 and a second bending mirror section 73 arranged on Y stage 42, two optical units 74 and 75 arranged on X stage 40, X fixed mirror 70X, and Y fixed mirror 70Y1 and the like, shown in FIG. 4. X fixed mirror 70X has the side surfaces on the +X side and the −X side mirror polished so that reflection surfaces are formed, and Y fixed mirror 70Y1 has the side surface on the −Y side mirror polished so that a reflection surface is formed. Sensor head section 68, X fixed mirror 70X, and Y fixed mirror 70Y1 are fixed to body BD that supports projection unit PU. X fixed mirror 70X is supported by suspension by a support member 77 (refer to FIG. 3) that connects to body BD, via an opening section formed in a part of frame FR.

Sensor head section 68 incorporates a light source, an optical system, and a plurality of analyzers (polarizers), a plurality of photoelectric conversion elements, a bending mirror and the like inside.

The first bending mirror section 72 and the second bending mirror section 73 each include a prism (or a mirror). The prism (or the mirror) has a reflection surface formed at an angle of 45 degrees with respect to an XZ plane and an YZ plane.

The first bending mirror section 72 reflects a beam BM1 (beam BM1 is actually configured of two beams separated apart in the vertical direction (the Z-axis direction), however, in order to avoid complication in the description below, the beams will be described as one beam) output from sensor head section 68, and makes the beam enter optical unit 74 previously described. Further, the second bending mirror section 73 reflects the other beam BM2 (beam BM2 is actually configured of two beams separated apart in the vertical direction (the Z-axis direction)) and makes the beam enter optical unit 75.

Optical unit 74 on which beam BM1 is incident includes a mirror 74a, and an optical member 74b arranged a predetermined distance apart on the +Y side of mirror 74a.

Figure 5:
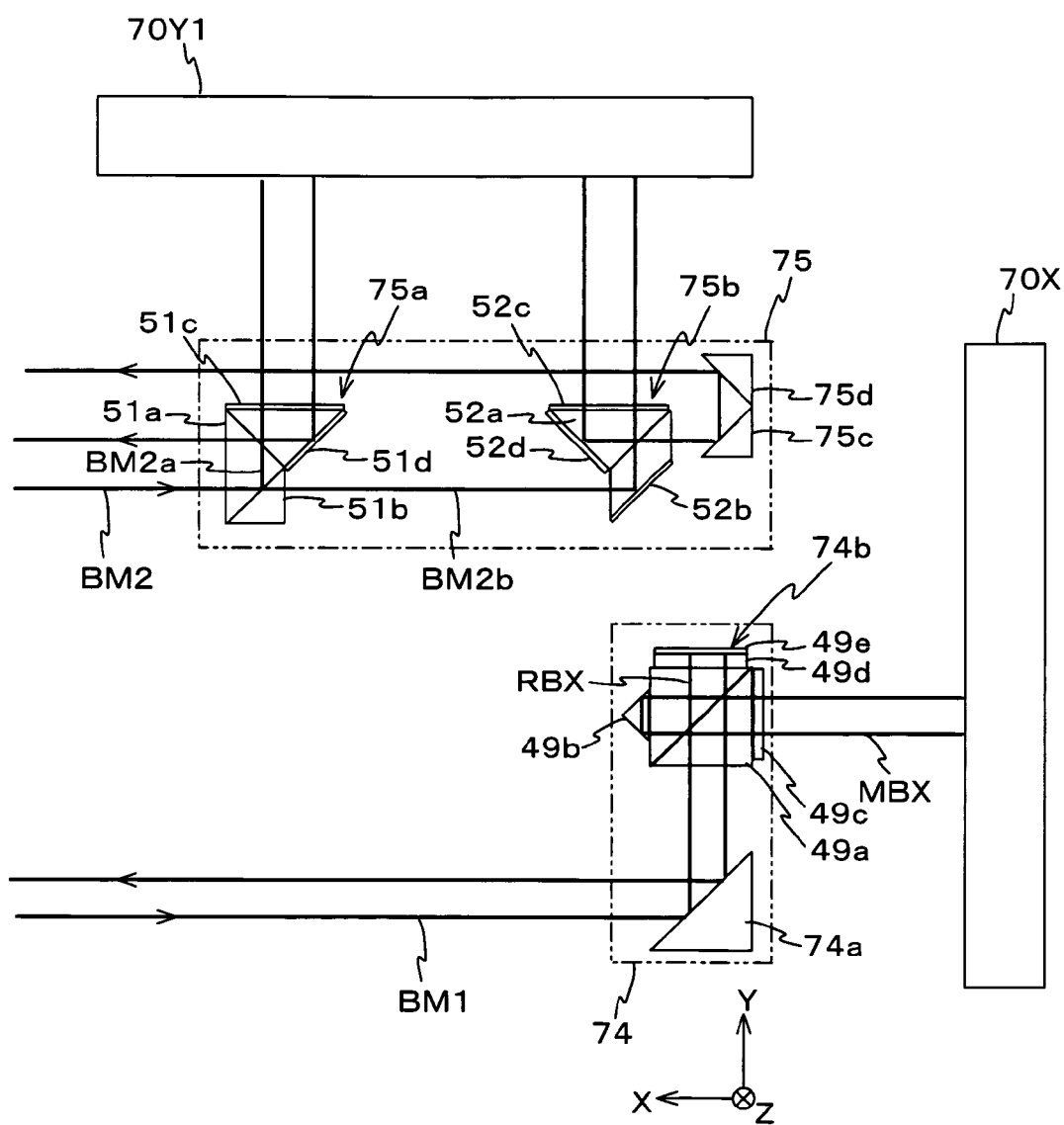
FIG. 5 is a view that shows a part of the alignment system interferometer system enlarged.

Optical member 74b is made up of parts such as a polarization beam splitter (PBS) 49a, a corner cube mirror (a retroreflector) 49b, quarter-wave plates (λ/4 plates) 49c and 49d, a reference mirror 49e, and the like which are integrated, as is shown enlarged in FIG. 5.

According to optical member 74b, beam BM1 reflected off mirror 74a enters polarization beam splitter 49a. Then, beam BM1 that has entered polarization beam splitter 49a is separated into a reference beam RBX consisting of a P polarization component that passes through a separating plane made of multilayer films inside polarization beam splitter 49a, and a measurement beam MBX consisting of an S polarization component reflected off the separating plane.

Then, measurement beam MBX reflected off the above separating plane passes through λ/4 plate 49c and is converted into a circular polarized light, and then is reflected by fixed mirror 70X.

The measurement beam reflected off fixed mirror 70X passes through λ/4 plate 49c again and is converted to P polarization, and then passes through the above separating plane and is folded back at corner cube mirror 49b. Then, measurement beam MBX that has been folded back passes through the above separating plane and λ/4 plate 49c and becomes a circular polarized light, and then is reflected again by fixed mirror 70X, and the reflected measurement beam passes through λ/4 plate 49c and is converted to S polarization and is reflected off the above separating plane, and then returns to sensor head section 68 via mirror 74a and the first bending mirror section 72.

Meanwhile, the reference beam (P polarization component) that has passed through the above separating plane passes through λ/4 plate 49d and is converted to a circular polarized light, which is reflected off the reflection surface of mirror 49e, and then the light passes through λ/4 plate 49d again so that it becomes a S polarization and is reflected off the above separating plane and then is folded back at corner cube mirror 49b. Then the reference beam that has been folded back is reflected again off the above separating plane and passes through λ/4 plate 49d and is converted to a circular polarized light, which is reflected off the reflection surface of mirror 49e, and then the light passes through λ/4 plate 49d again so that it becomes a P polarization and passes through the above separating plane and is synthesized concentrically with the return light of the measurement beam (S polarization) and is reflected off mirror 74a and the first bending mirror section 72 and then passes through the analyzer of the detection unit inside sensor head section 68. Accordingly, an interference beam of measurement beam MBX and reference beam RBX is output from the analyzer, and the interference beam is received by the photoelectric conversion element and positional information of alignment system stage AST1 in the X-axis direction with fixed mirror 70X serving as a reference is sent to main controller 50. As is previously described, because beam BM1 is configured of two beams separated apart in the Z-axis direction, main controller 50 detects not only the positional information of alignment system stage AST1 (alignment system ALG1) in the X-axis direction but also the rotational information in the θy direction (rolling amount) from the positional information in the X-axis direction which is obtained from the two beams.

Optical unit 75 includes optical members 75a and 75b, and bending mirrors 75c and 75d, as is shown enlarged in FIG. 5.

Optical member 75a includes a polarization beam splitter 51a, a λ/4 plate 51c arranged on the side surface of polarization beam splitter 51a on the +Y side, a half mirror 51b, and a mirror 51d. Optical member 75b includes a polarization beam splitter 52a, a λ/4 plate 52c arranged in polarization beam splitter 52a, a mirror 52b, and a mirror 52d.

In optical member 75a, beam BM2 reflected off mirror 73 enters half mirror 51b, and at half mirror 51b, beam BM2 is separated into a first beam BM2a reflected off half mirror 51b and a second beam BM2b that moves ahead.

The first beam BM2a is divided into a measurement beam consisting of a P polarization component that passes through a separating plane of polarization beam splitter 51a, and a reference beam consisting of an S polarization component reflected off the separating plane.

The measurement beam that has passed through the above separating plane passes through λ/4 plate 51c and is converted into a circular polarized light, and then after the light is reflected by fixed mirror 70Y1, the light passes through λ/4 plate 51c again and is converted to S polarization and is reflected off the above separating plane and mirror 51d. Then the reflected measurement beam passes through λ/4 plate 51c and is converted into a circular polarized light, and then is reflected by fixed mirror 70Y1 again, and after this the light passes through λ/4 plate 51c and is converted to P polarization, and then passes through the above separating plane via mirror 51d and returns to sensor head section 68 via the second bending mirror section 73 in FIG. 4.

Meanwhile, the reference beam (P polarization component) that has been reflected off the above separating plane is reflected off polarization beam splitter 51a, and after this the beam returns to sensor head section 68 via the second bending mirror section 73. The reference beam is synthesized concentrically with the return light of the measurement beam (P polarization) and then passes through the analyzer of the detection unit inside sensor head section 68. Accordingly, an interference beam of the measurement beam and the reference beam is output from the analyzer, and the interference beam is received by the photoelectric conversion element and positional information of alignment system stage AST1 in the Y-axis direction with fixed mirror 70Y1 serving as a reference is sent to main controller 50.

Meanwhile, the second beam BM2b that has passed through half mirror 51b is reflected off mirror 52b, and is divided into a measurement beam consisting of a P polarization component that passes through a separating plane of polarization beam splitter 52a, and a reference beam consisting of an S polarization component reflected off the separating plane.

The measurement beam that has passed through polarization beam splitter 52a passes through λ/4 plate 52c and is converted into a circular polarized light, and then after the light is reflected by fixed mirror 70Y1, the light passes through λ/4 plate 52c and is converted to S polarization and is reflected off the above separating plane and mirror 52d. Then the reflected measurement beam passes through λ/4 plate 52c and then is converted into a circular polarized light, and then is reflected by fixed mirror 70Y1 again, and after this the light passes through λ/4 plate 52c and is converted to P polarization, and then passes through the above separating plane via mirror 52d and returns to sensor head section 68 via mirrors 75c and 75d and the second bending mirror section 73 in FIG. 4.

Meanwhile, the reference beam reflected off polarization beam splitter 52a returns to sensor head section 68 via mirrors 75c and 75d and the second bending mirror section 73. The reference beam is synthesized concentrically with the return light of the measurement beam (P polarization) and then passes through the analyzer of the detection unit inside sensor head section 68. Accordingly, an interference beam of the measurement beam and the reference beam is output from the analyzer, and the interference beam is received by the photoelectric conversion element and positional information of alignment system stage AST1 in the Y-axis direction with fixed mirror 70Y1 serving as a reference is sent to main controller 50. As is previously described, because beams BM2a and BM2b are each configured of two beams separated apart in the Z-axis direction, main controller 50 detects not only the positional information of alignment system stage AST1 (alignment system ALG1) in the Y-axis direction but also the rotational information in the θz direction (yawing amount) and the rotational information in the θx direction (pitching amount) from the positional information in the Y-axis direction which is obtained from the four beams.

Referring back to FIG. 3, although the other alignment system stage AST2 that moves the other alignment system ALG2 is symmetric, alignment system stage AST2 has a configuration similar to alignment system stage AST1.

More specifically, alignment system stage AST2 includes a Y stage 142 movable in the Y-axis direction and an X stage 140 movable in the X-axis direction with respect to Y stage 142.

Y stage 142 is driven in the Y-axis direction by a Y linear motor YLM2 that includes a Y-axis stator 146 fixed to frame FR and a Y-axis mover 148 fixed to the −X side edge section of Y stage 142, and X stage 140 is driven in the X-axis direction and rotationally driven in the θz direction by a pair of X linear motors XLM3 and XLM4 that includes a pair of X-axis stators 152A and 152B whose longitudinal direction is in the X-axis direction, fixed to the lower surface (the −Z side surface) of Y stage 142, and a pair of X-axis movers 154A and 154B fixed to the end sections of X stage 140 on the −Y side and +Y side. In X linear motor XLM4, a voice coil motor is arranged together as in X stage 40 previously described, so that X stage 140 can be finely driven in the Y-axis direction.

Alignment system ALG2 is an alignment system by the image processing method whose configuration is completely the same as alignment system ALG1, therefore the description of the system therein will be omitted.

Further, on the lower surface (−Z side surface) of Y stage 142 and X stage 140, various optical members that constitute an alignment system interferometer system 169 (shown only in FIG. 6) are placed.

Although alignment system interferometer system 169 is symmetric, alignment system interferometer system 169 has a configuration similar to alignment system interferometer system 69, therefore, the details here will be omitted, however, the system includes a sensor head section 168, and various optical members arranged on X stage 140 and Y stage 142. Interferometer system 169 of the embodiment can detect positional information in the X-axis and Y-axis directions, and rotational information in the θx, θy, and θz directions of alignment system stage AST2 (alignment system ALG2), with fixed mirror 70X (the reflection surface on the −X side) and a fixed mirror 70Y2 (the reflection surface on the −Y side) arranged in body BD serving as a reference.

In the embodiment, base platforms BS1 and BS2 were each supported by frame FR via vibration isolation mechanisms 162, however, for example, frame FR can be installed on the floor surface (or on a base plate) via vibration isolation mechanisms 162, and base platforms BS1 and BS2 can simply be fixed to frame FR. Further, in the embodiment, alignment systems ALG1 and ALG2 and stage unit 160 are arranged in frame FR, however, in the case exposure apparatus 100 employs the configuration of supporting projection unit PU by suspension with respect to the mainframe as is previously described, for example, alignment systems ALG1 and ALG2 and stage unit 160 can be supported by suspension integrally with projection unit PU, or alignment systems ALG1 and ALG2 and stage unit 160 can be arranged in a measurement frame supported by suspension independently from the mainframe. Further, at least a part of alignment system interferometer systems 69 and 169 can be arranged in the measurement frame along with alignment systems ALG1 and ALG2. Furthermore, alignment systems ALG1 and ALG2 and the nozzle unit previously described can be arranged in the same measurement frame, or in a different measurement frame.

FIG. 6 shows a block diagram of the main configuration of a control system in exposure apparatus 100 of the embodiment. The control system in FIG. 6 is configured including a so-called microcomputer (or workstation) made up of a CPU (Central Processing Unit), ROM (Read Only Memory), RAM (Random Access Memory), and the like, and is mainly composed of main controller 50, which serves as a control unit that controls the overall operation of the entire apparatus.

Next, details on a parallel processing operation using wafer stage WST and measurement stage MST in exposure apparatus 100 of the embodiment that has the arrangement described above will be described, referring to FIGS. 7A to 11. Each section operates under the control of main controller 50, however, in order to avoid complication in the description, details therein will be omitted other than when necessary. Further, during the operation below, main controller 50 controls the supply operation and recovery operation of the liquid of liquid immersion unit 132, and on the lower side of the lowest optical element of projection optical system PL, an immersion area of liquid Lq is constantly formed.

Further, the relation between a coordinate system of alignment system interferometer systems 69 and 169 for measuring the position of alignment systems ALG1 and ALG2 and a coordinate system of interferometer system 118 for measuring the position of wafer stage WST is to be measured in advance using, for example, reference marks or the like on measurement stage MST. More specifically, the relation (in other words, the position of the detection center of alignment systems ALG1 and ALG2 on the coordinate system of interferometer system 118) is to be obtained during the detection of the reference marks on measurement stage MST by alignment systems ALG1 and ALG2, based on the position of alignment systems ALG1 and ALG2 obtained by interferometer systems 69 and 169 and the position of measurement stage MST obtained by interferometer system 118. In the embodiment, detection of the alignment marks on wafer W is performed by moving alignment systems ALG1 and ALG2 based on the above relation, the shot map data previously described (including alignment shot data), and the measurement values of interferometer systems 69, 169, and 118. Further, measurement of the baseline (the positional relation or the distance between the projection position of the reticle pattern by projection optical system PL and the detection center of alignment systems ALG1 and ALG2) of alignment systems ALG1 and AGL2 is to be completed already, and main controller 50 is to store the baseline in memory, with the baseline being made to correspond with the position of alignment systems ALG1 and AGL2 during the measurement. In the baseline measurement, reference marks or the like are used of a reticle alignment system and measurement stage MST whose details are disclosed in, for example, Kokai (Japanese Patent Unexamined Application Publication) No. 7-176468 (and the corresponding U.S. Pat. No. 5,646,413) and the like.

Figure 7A:
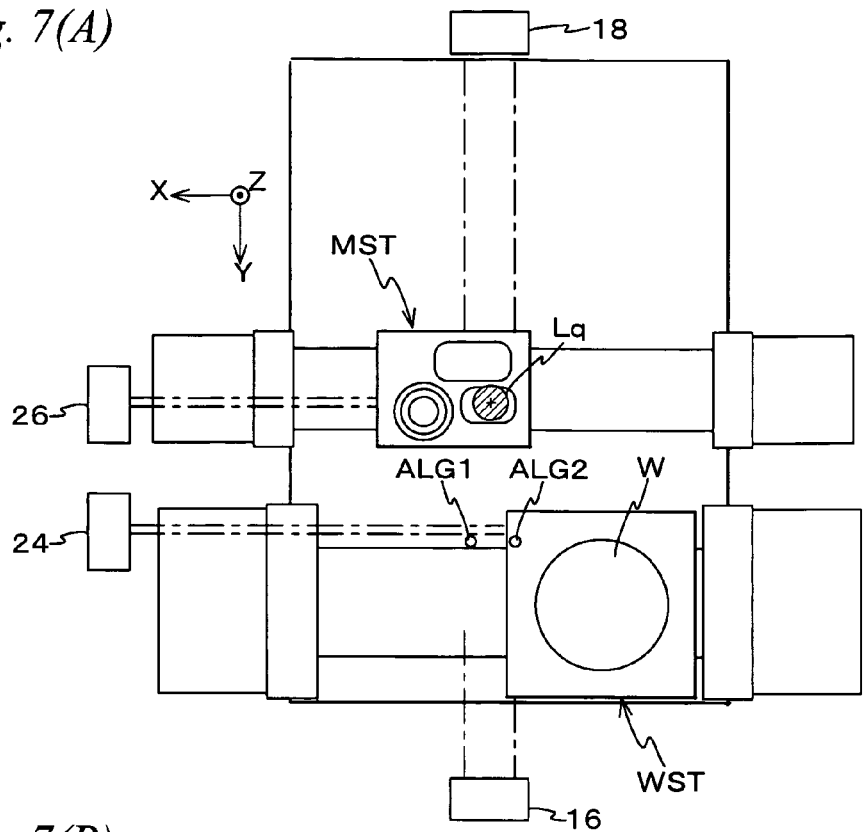
FIGS. 7A and 7B are views (No. 1) for describing a parallel processing operation performed by a wafer stage and a measurement stage.

FIG. 7A shows the state of stage unit 150 when the wafer on wafer stage WST is exchanged at the loading position previously described. At this point, the position of wafer stage WST is measured by X interferometer 24 and Y interferometer 16. However, wafer stage WST is in a state exposed to only one beam of the two beams of Y interferometer 16. Further, during the wafer exchange, measurement stage MST is placed under projection optical system PL instead of wafer stage WST, and various measurements such as aerial image measurement, wavefront aberration measurement and the like are appropriately performed.

When wafer W on wafer stage WST is exchanged by a wafer exchange mechanism (not shown) from this state, wafer stage WST moves in the +X direction. During this movement, because the two beams of Y interferometer 16 begin to irradiate wafer stage WST, interferometer combination (making the two measurement values of Y interferometer 16 correspond) is performed.

Figure 7B:
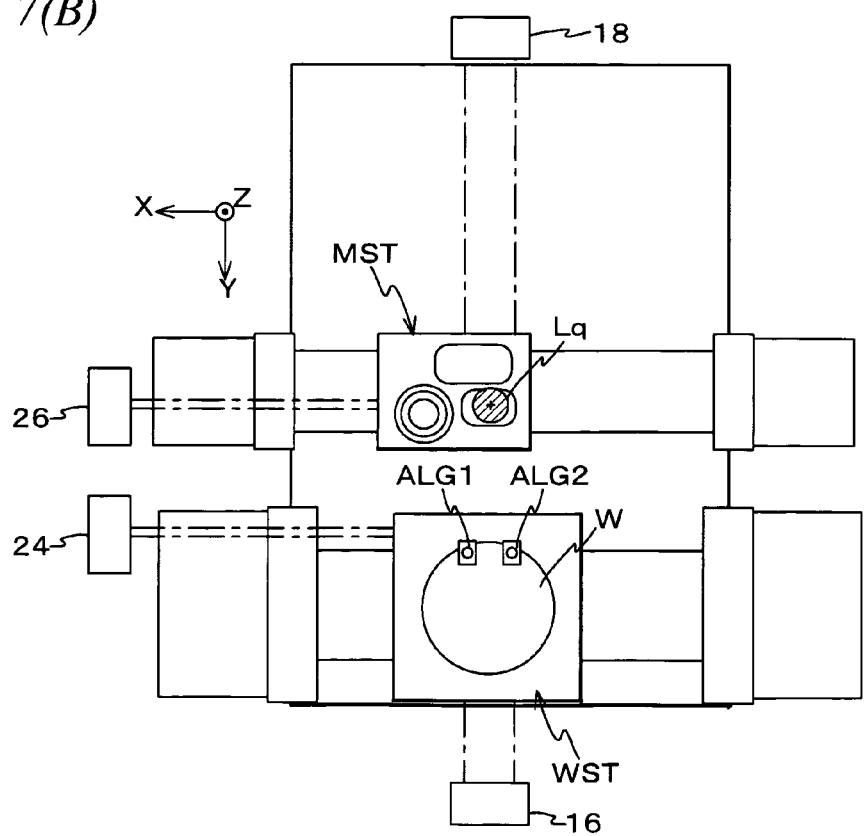

Then, wafer stage WST moves further in the +X direction, and at the point where wafer stage WST is positioned at the position shown in FIG. 7B, a first detection operation of the alignment marks formed on wafer W is performed.

Figure 11:
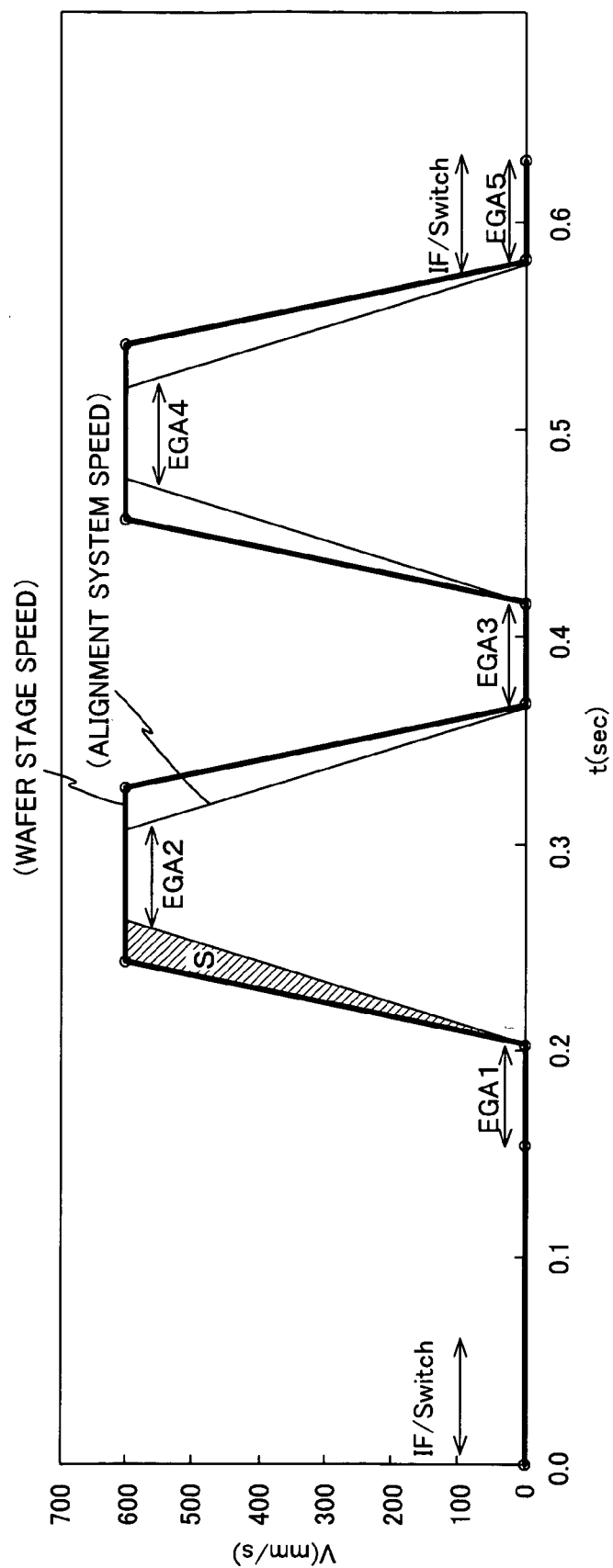
FIG. 11 is a graph that shows a movement speed of the wafer stage and the alignment system.

In this case, as is shown in FIG. 11, which is a graph that shows the speed of wafer stage WST in the Y-axis direction, on the first detection operation (the section shown as EGA1), wafer stage WST is stationary (speed 0), and alignment systems ALG1 and ALG2 are also positioned at predetermined positions and are stationary (speed 0). Accordingly, a first set of alignment marks on wafer W is set within each of the detection areas of alignment systems ALG1 and ALG2, and based on positional information of wafer stage WST measured by interferometers 16 and 24, positional information of alignment systems ALG1 and ALG2 measured by alignment system interferometer systems 69 and 169, and the shift amount of the alignment marks from the detection center detected using alignment systems ALG1 and ALG2, the positional information (the coordinate values) of the first set of alignment marks are each detected.

Search alignment using search alignment marks can be performed prior to the first detection operation of the alignment marks.

Figure 8A:
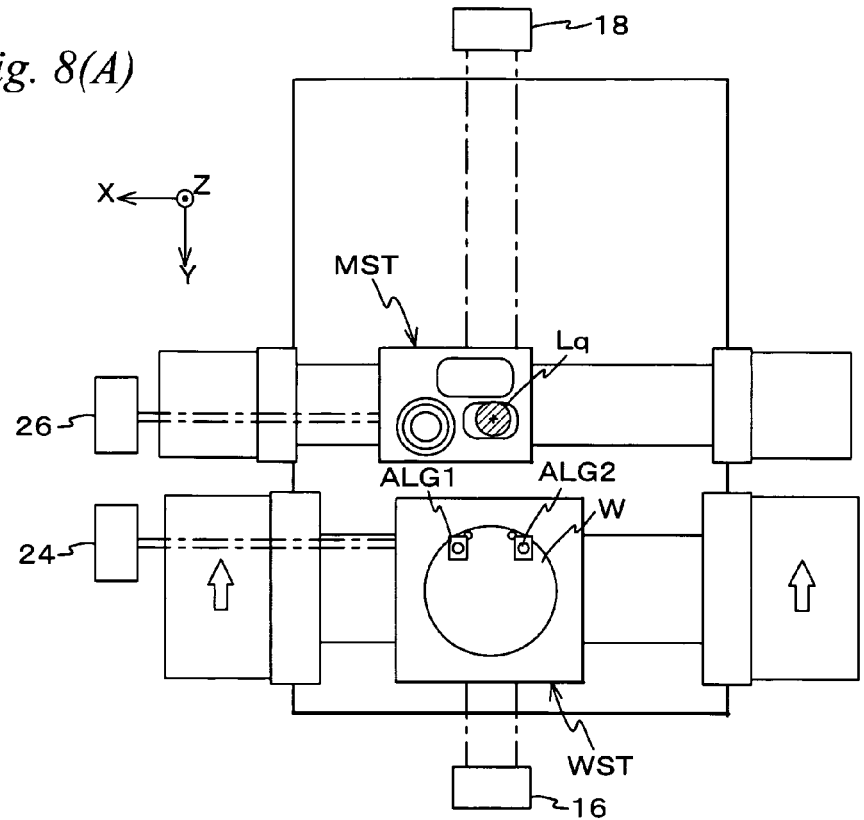
FIGS. 8A and 8B are views (No. 2) for describing the parallel processing operation performed by the wafer stage and the measurement stage.

Next, at the point where the above first detection operation has been completed, wafer stage WST begins acceleration in the −Y direction. Further, alignment systems ALG1 and ALG2 also simultaneously begin to accelerate in the −Y direction accelerating at a level smaller than wafer stage WST, while alignment system ALG1 begins to move in the +X direction and alignment system ALG2 begins to move in the −X direction. Then, at the point where the speed of wafer stage WST and each of the alignment systems ALG1 and ALG2 reach a predetermined level (around 600 mm/s), the stage and the systems each begin a constant movement. At the point of this constant movement, the movement of alignment systems ALG1 and ALG2 in the X-axis direction has been completed, and a second set of alignment marks on wafer W is also to be set within the detection areas of alignment systems ALG1 and ALG2, as is shown in FIG. 8A. In the above movement, because the acceleration of wafer stage WST and alignment systems ALG1 and ALG2 differ, the relative positional relation between wafer W and alignment systems ALG1 and ALG2 in the Y-axis direction changes by a predetermined distance (the distance corresponding to an area S in FIG. 11) when compared with the case shown in FIG. 7B.

Then, after the constant movement in the Y-axis direction begins, in a state continuing the constant movement, a second detection operation (the state EGA2 in FIG. 11) of the alignment marks is performed. In this case, because the speed of wafer stage WST coincides with the speed of alignment systems ALG1 and ALG2, the relative speed is zero. Accordingly, it is possible to perform mark detection under the same conditions as when wafer stage WST and alignment systems ALG1 and ALG2 are stationary.

Figure 8B:
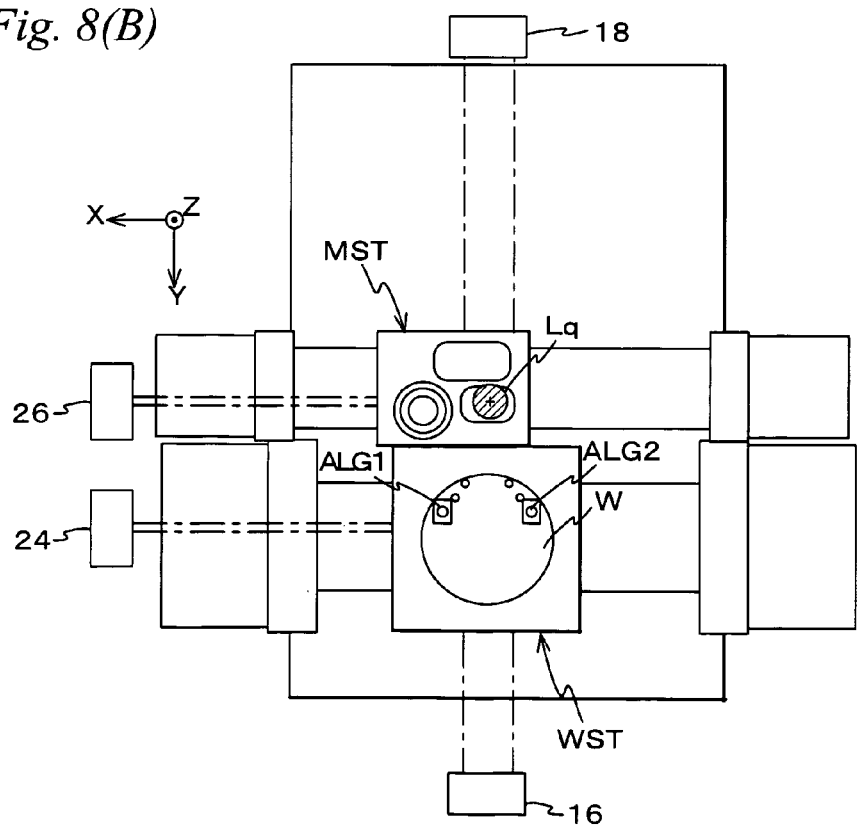

Then, at the point where the second detection operation has been completed, alignment systems ALG1 and ALG2 begin deceleration, and after a predetermined period of time, wafer stage WST begins deceleration. And then, at the point where wafer stage WST and measurement stage MST are closest (or come into contact) as is shown in FIG. 8B, the speed of wafer stage WST is to be zero. During the above deceleration, alignment system ALG1 moves in the +X direction while alignment system ALG2 moves in the −X direction, and alignment systems ALG1 and ALG2 are each positioned so that a third set of alignment marks on wafer W is set within the detection areas of alignment systems ALG1 and ALG2. Then, in a state where wafer stage WST and alignment systems ALG1 and ALG2 are stationary, a third detection operation (the state EGA3 in FIG. 11) of the alignment marks is performed.

Then, at the point where the third detection operation has been completed, wafer stage WST and alignment systems ALG1 and ALG2 begin acceleration, similar to the first measurement operation and the second measurement operation. In this case, wafer stage WST and measurement stage MST are driven in the −Y direction in a state where wafer stage WST and measurement stage MST are in contact (or in a state where a subtle distance is maintained) (that is, measurement stage MST is also accelerated by the same acceleration as wafer stage WST). Further, along with this operation, alignment systems ALG1 and ALG2 are also slightly driven in the +X and −X directions, respectively, and a fourth set of alignment marks on wafer W is set (FIG. 9A) within the detection areas of alignment systems ALG1 and ALG2. Then, at the point where wafer stage WST (and measurement stage MST) and each of the alignment systems ALG1 and ALG2 reach the same speed, a fourth detection operation (the state EGA4 in FIG. 11) of the alignment marks is performed. Also in this case, because the relative speed of wafer stage WST and alignment systems ALG1 and ALG2 is zero, it is possible to perform alignment under the same accuracy as when wafer stage WST and alignment systems ALG1 and ALG2 are stationary.

Figure 9A:
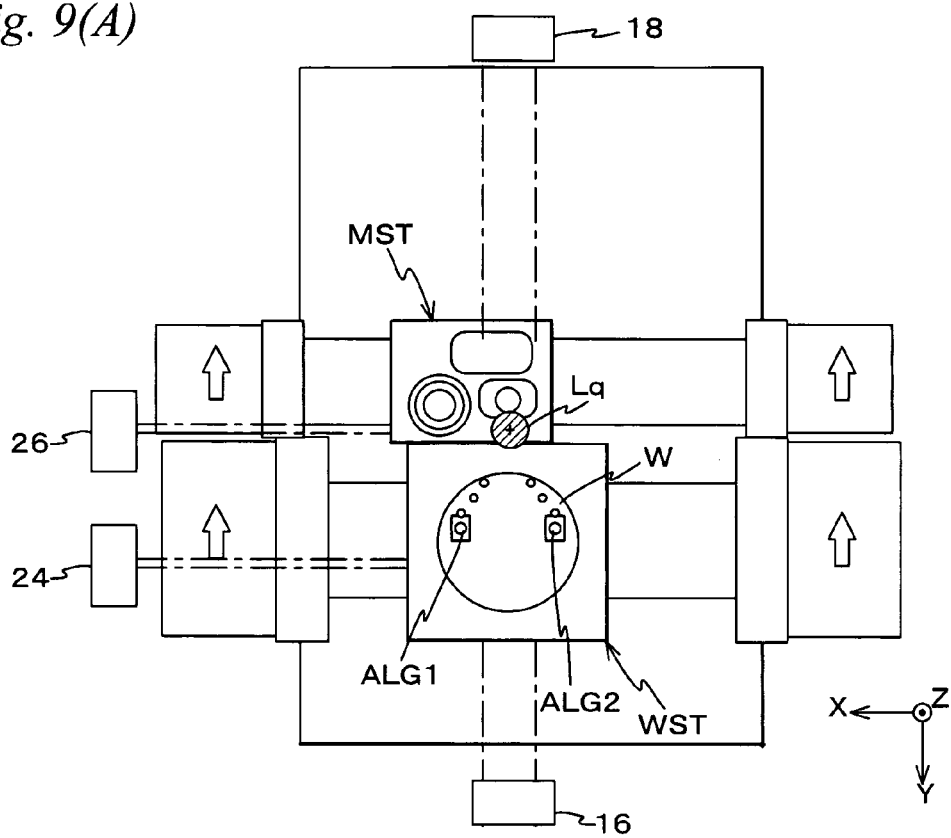
FIGS. 9A and 9B are views (No. 3) for describing the parallel processing operation performed by the wafer stage and the measurement stage.
Figure 9B:
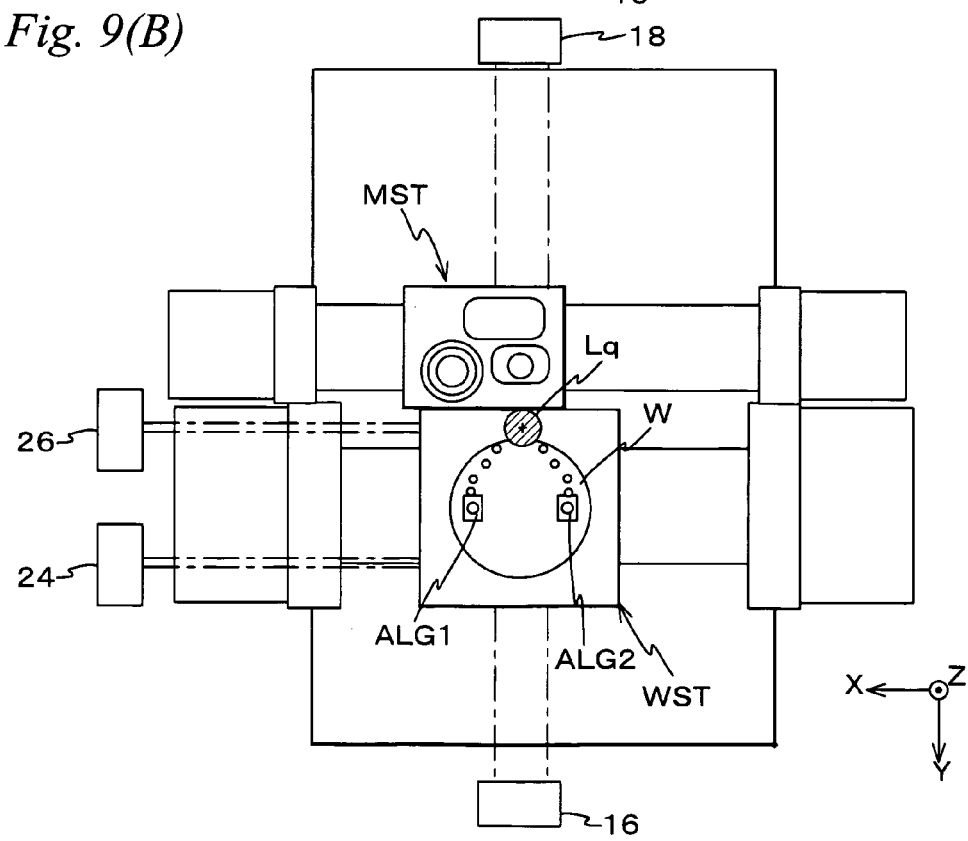

Then, at the point where the fourth detection operation has been completed, alignment systems ALG1 and ALG2 begin deceleration, and then, wafer stage WST (measurement stage MST) also begins deceleration. During this deceleration, both the beams of X interferometers 24 and 26 begin to irradiate wafer stage WST, therefore, at the point where the speed of wafer stage WST and alignment systems ALG1 and ALG2 become zero, interferometer combination (making the measurement values of X interferometers 24 and 26 correspond) is performed. Further, as is shown in FIG. 9B, during the deceleration operation, liquid Lq is delivered onto wafer stage WST, and a fifth set of alignment marks on wafer W is set within the detection areas of alignment systems ALG1 and ALG2.

Then, at the point where the speed of wafer stage WST alignment systems ALG1 and ALG2 become zero, a fifth detection operation (the state EGA5 in FIG. 11) of the alignment marks is performed. In the manner described above, ten alignment marks on wafer W can be detected, using alignment systems ALG1 and ALG2.

Figure 10A:
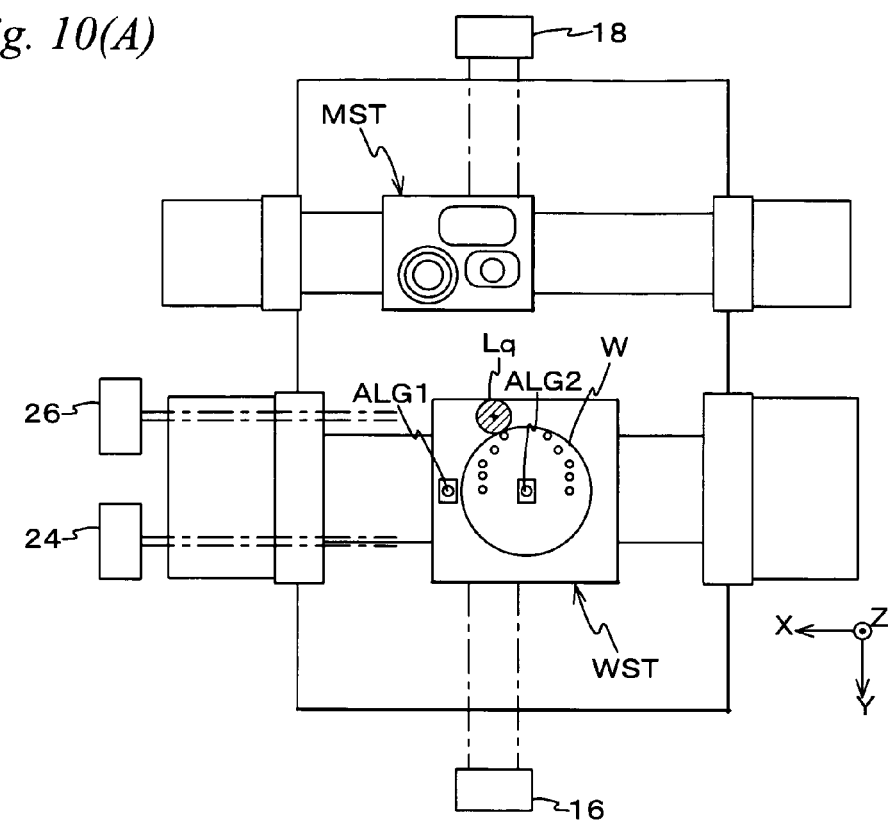
FIGS. 10A and 10B are views (No. 4) for describing the parallel processing operation performed by the wafer stage and the measurement stage.
Figure 10B:
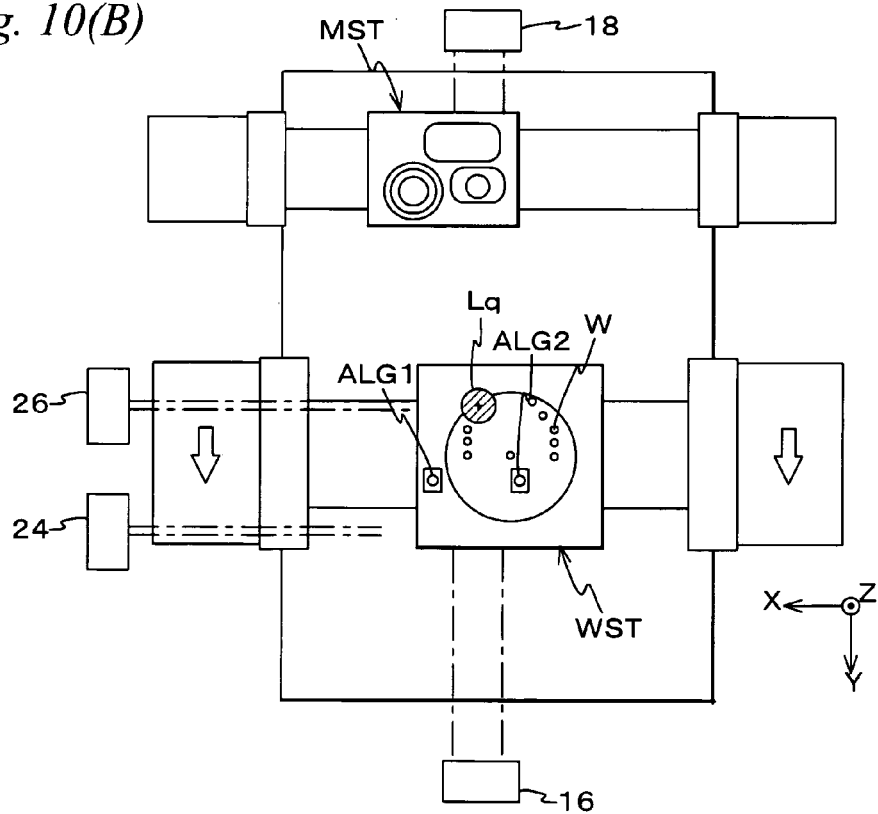

Then, as is shown in FIG. 10A, wafer stage WST moves to the exposure starting position for performing exposure of the first shot area on wafer W, and at the point where the movement has been completed, or during the movement, the alignment mark in the center of wafer W is to be detected using alignment system ALG2.

When a total of 11 alignment marks have been detected in the manner described above, in the embodiment, the EGA (Enhanced Global Alignment) method is employed as is disclosed in, for example, Kokai (Japanese Patent Unexamined Application Publication) No. 61-44429 (and the corresponding U.S. Pat. No. 4,780,617), and main controller 50 performs a statistical calculation by the least squares method using the detection results of the alignment marks (the coordinate values on an orthogonal coordinate system XY set by interferometer system 118) and the designed arrangement information of the shot areas, and computes the arrangement coordinates of all or a part of (in the embodiment, half of the shot areas (the upper half) on the −Y side of wafer W) the shot areas subject to the exposure processing on wafer W. And, by moving wafer stage WST based on the arrangement coordinates that have been computed, exposure operation can be performed on half of the −Y side on wafer W. In this case, the exposure is performed by the step-and-scan method as in the conventional exposure. Therefore, details therein will be omitted.

Then, during the exposure operation of half of the −Y side, alignment marks on half of the +Y side (the lower half) of wafer W are detected while moving alignment systems ALG1 and ALG2 similar to the description above. In this case, for example, eight alignment marks are to be detected while exposure of the shot areas on half of the −Y side is being performed. Then using the positional information (coordinate values) of the alignment marks that have been detected, main controller 50 computes the arrangement information of the shot areas on half of the +Y side (the lower half) of wafer W by the EGA method.

Then, at the point where exposure of the shot areas on half of the −Y side has been completed, alignment by the EGA method (computation of the arrangement information of the sot areas) of the shot areas on half of the +Y side is also complete, therefore, after all the exposure operations of the shot areas on half of the −Y side have been completed, exposure of the shot areas on half of the +Y side is to begin.

At the point where exposure of the entire wafer W has been completed in the manner described above, wafer stage WST moves to loading position WEP previously described, and following the movement of wafer stage WST, measurement stage MST moves and liquid Lq is passed on to measurement stage MST. Then, wafer exchange is performed, and before wafer stage WST on which a wafer that is to undergo the next exposure processing is mounted finishes moving to the position shown in FIG. 7B, alignment systems ALG1 and ALG2 return to the initial position shown in FIG. 7B, and perform processing on the next wafer.

As is described in detail so far, according to the first embodiment, while wafer stage WST moves from the loading position (the position shown in FIG. 7A) to the exposure starting position (the position shown in FIG. 10A), a part of alignment systems ALG1 and ALG2 are moved and marks on the wafer are detected, using alignment systems ALG1 and ALG2. Therefore, time for mark detection does not have to be arranged separately from the movement time of wafer stage WST from the loading position to the exposure starting position, as in the conventional apparatus. Accordingly, the time required for the exposure processing of the wafer can be reduced, and the throughput of the entire exposure process can be improved. Further, more alignment marks can be measured when compared with the conventional apparatus, therefore, alignment with high precision can be performed, which allows exposure to be performed with high precision.

Further, according to the first embodiment, marks on the wafer are detected in a state where at least a part of alignment systems ALG1 and ALG2 follow wafer stage WST (a state where the relative speed of the detection areas previously described and the marks is substantially zero). Therefore, the marks can be detected with good precision using the alignment systems, even while wafer stage WST is moving. Accordingly, the detection time of the marks can be reduced without degrading the detection accuracy of the marks, which makes it possible to improve the throughput of the entire exposure process.

Further, in the first embodiment, alignment marks on the wafer are detected using two alignment systems, ALG1 and ALG2, therefore, more marks can be detected within a predetermined period of time compared with the case when only one alignment system is used.

Further, in the first embodiment, alignment systems ALG1 and ALG2 are moved also in the X-axis direction, therefore, even when wafer stage WST moves only in the Y-axis direction, an arbitrary alignment mark located on the wafer can be detected. Accordingly, even in the case when the movement of the wafer stage and the alignment operation are performed at the same time, the movement of the wafer stage does not have to be restricted.

Further, in the first embodiment, alignment systems ALG1 and ALG2 move with the lower surface of base platforms BS1 and BS2 serving as a reference plane, which are supported by frame FR separated vibrationwise from body BD. Accordingly, this can keep the vibration due to the movement of alignment systems ALG1 and ALG2 from affecting the exposure accuracy. Meanwhile, because fixed mirrors 70X, 70Y1, and 70Y2 constituting the interferometer system that measures the position of alignment systems ALG1 and ALG2 are fixed on the body BD side, the position of alignment systems ALG1 and ALG2 can be detected with body BD serving as a reference.

In the above first embodiment, a total of 19 alignment marks are detected. The present invention, however, is not limited to this, and 20 or more alignment marks, or 18 or less alignment marks can be detected. Especially when exposure of half of the −Y side on wafer W is being performed, substantially all the alignment marks of half of the +Y side on wafer W can be detected by the movement of alignment systems ALG1 and ALG2, therefore, even if the number of alignment marks that are to be measured is increased, it does not affect the throughput.

In the above first embodiment, as alignment system stage unit 160, the configuration as the one shown in FIG. 3 was employed, however, the present invention is not limited to this, and a configuration can be employed where the stage unit is equipped with one Y stage that moves in the Y-axis direction and two X stages that move in the X-axis direction along the Y stage. The point is, as long as at least a part of alignment systems ALG1 and ALG2, or in other words, the detection areas are two-dimensionally movable, then various configurations can be employed.

Further, in the above first embodiment, the position of the shot areas of half of the −Y side on wafer W was computed using the positional information of the above 11 alignment marks detected before the beginning of the exposure operation, and the position of the shot areas of half of the +Y side on wafer W was computed using the positional information of the above eight alignment marks detected after the beginning of the exposure operation. However, for example, the position of the shot areas of half of the +Y side on wafer W can be computed also using the positional information of at least one of the alignment marks detected before the beginning of the exposure operation.

Furthermore, in the above first embodiment, the position of the shot areas of half of the −Y side on wafer W was computed using only the positional information of the alignment marks detected before the beginning of the exposure operation, however, for example, of the shot areas of half of the −Y side on wafer W, regarding the shot areas from the second shot area onward, the position can be computed also using the positional information of at least one alignment mark detected after the beginning of the exposure operation. In this case, in different shot areas from the second shot area onward, the number of positional information of the alignment marks detected after the beginning of the exposure operation used for computing the position can be different. For example, the position from the second shot area onward can be computed while the positional information of the alignment marks detected after the beginning of the exposure operation is sequentially added to the positional information of the alignment marks detected before the beginning of the exposure operation.

The position of all the shot areas of half of the −Y side on wafer W does not have to be computed before the beginning of the exposure operation, and the exposure operation can begin at the point where at least the position of the first shot area has been computed. Further, the number of shot areas whose position is computed before the beginning of the exposure operation and the number of shot areas whose position is computed after the beginning of the exposure operation does not have to be the same, and for example, the number of shot areas whose position is computed before the beginning of the exposure operation can be less than the number of shot areas whose position is computed after the beginning of the exposure operation. In this case, when compared with the above first embodiment, reducing the number of alignment marks that are to be detected before the beginning of the exposure operation can improve the throughput. Furthermore, in the detection operation of the alignment marks before the beginning of the exposure operation, wafer stage WST can be moved not only in the Y-axis direction but also in the X-axis direction.

The present invention is not limited to the sequence described in the above first embodiment, and for example, a sequence like the one described in a second embodiment below can also be employed.

A Second Embodiment

Next, a second embodiment of the present invention will be described. The configuration of the exposure apparatus and the like in the second embodiment is similar to the configuration in the above first embodiment, and only the detection sequence of the alignment marks on wafer stage WST is different. Therefore, in the description below, in order to avoid redundant explanations, the same reference numerals will be used for the sections that are the same as the first embodiment previously described, and the description thereabout will be omitted.

Figure 12A:
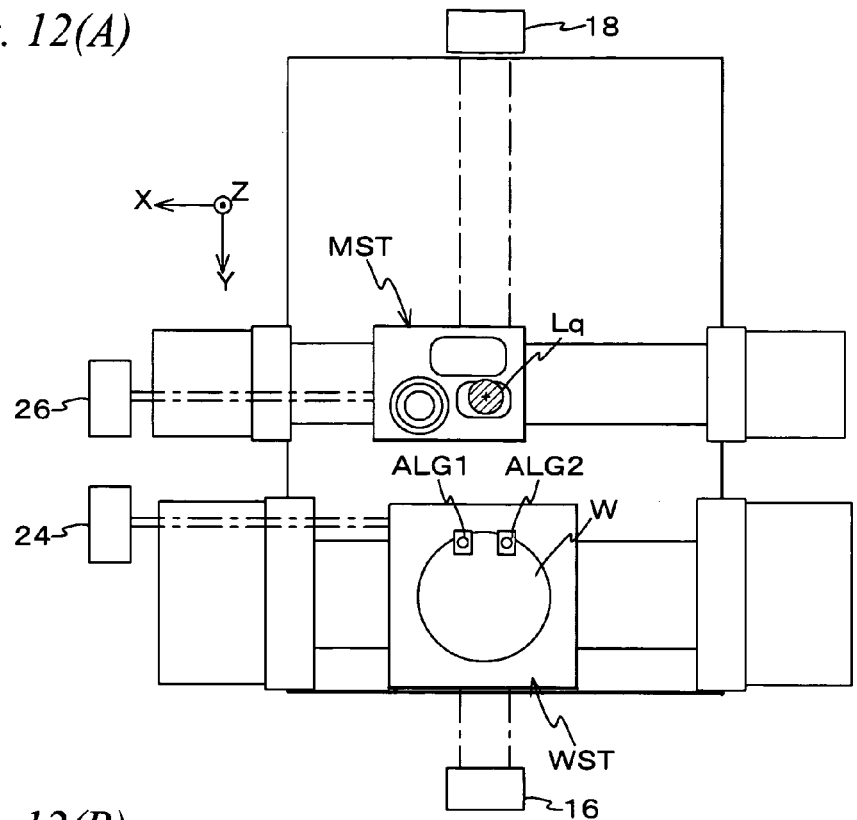
FIGS. 12A and 12B are views (No. 1) for describing a parallel processing operation performed by a wafer stage and a measurement stage related to a second embodiment.

Similar to the first embodiment, FIG. 12A shows a state where detection of a first set of alignment marks is performed (corresponding to FIG. 7B in the first embodiment).

When the detection of the first set of alignment marks (a first detection operation) is completed in the state shown in FIG. 12A (in this case, wafer stage WST and alignment systems ALG1 and ALG2 are in a stationary state), wafer stage WST and alignment systems ALG1 and ALG2 begin to move in the +Y direction. At this point, alignment systems ALG1 and ALG2 also begin to move in the X-axis direction.

Figure 12B:
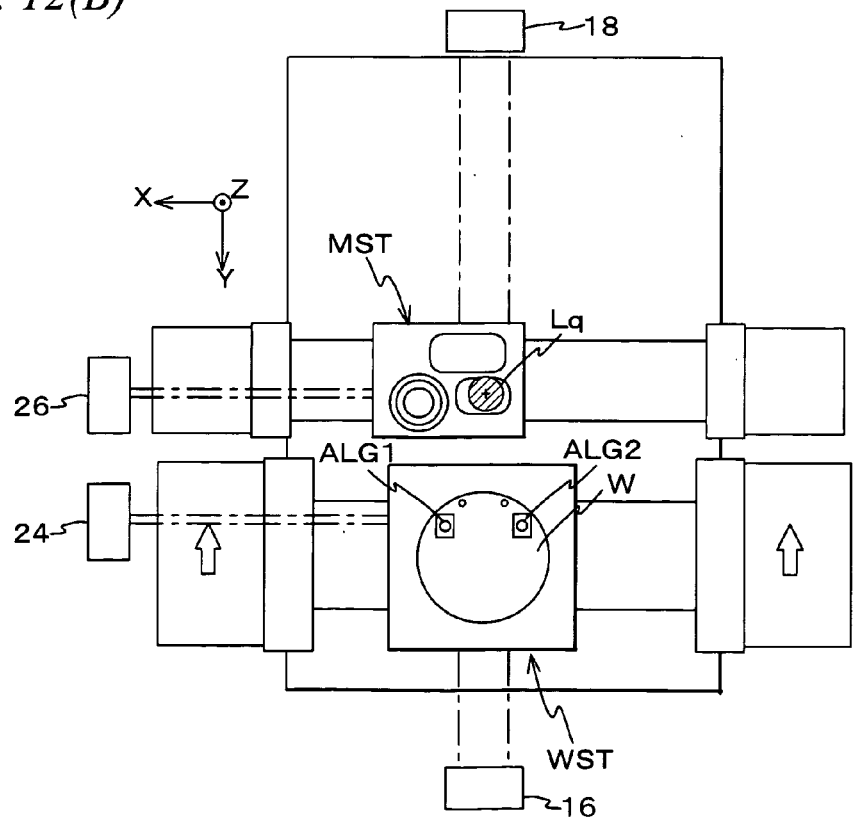

Then, after wafer W has been moved in the Y-axis direction for a distance longer than the first embodiment (and is also in a constant movement state), detection of a second set of alignment marks (a second detection operation) is performed, as is shown in FIG. 12B. As is shown in FIG. 12B, it can be seen that the distance in the Y-axis direction between the second set of alignment marks and the first set of alignment marks is set wider than the first embodiment (FIG. 8A).

Figure 13A:
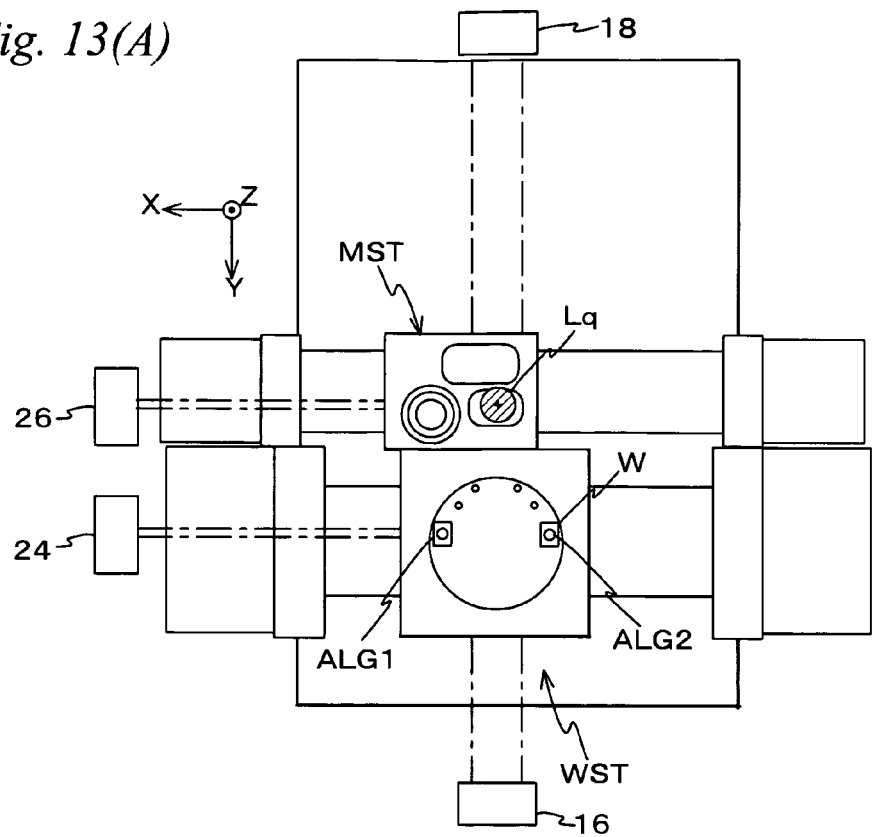
FIGS. 13A and 13B are views (No. 2) for describing the parallel processing operation performed by the wafer stage and the measurement stage related to the second embodiment.
Figure 13B:
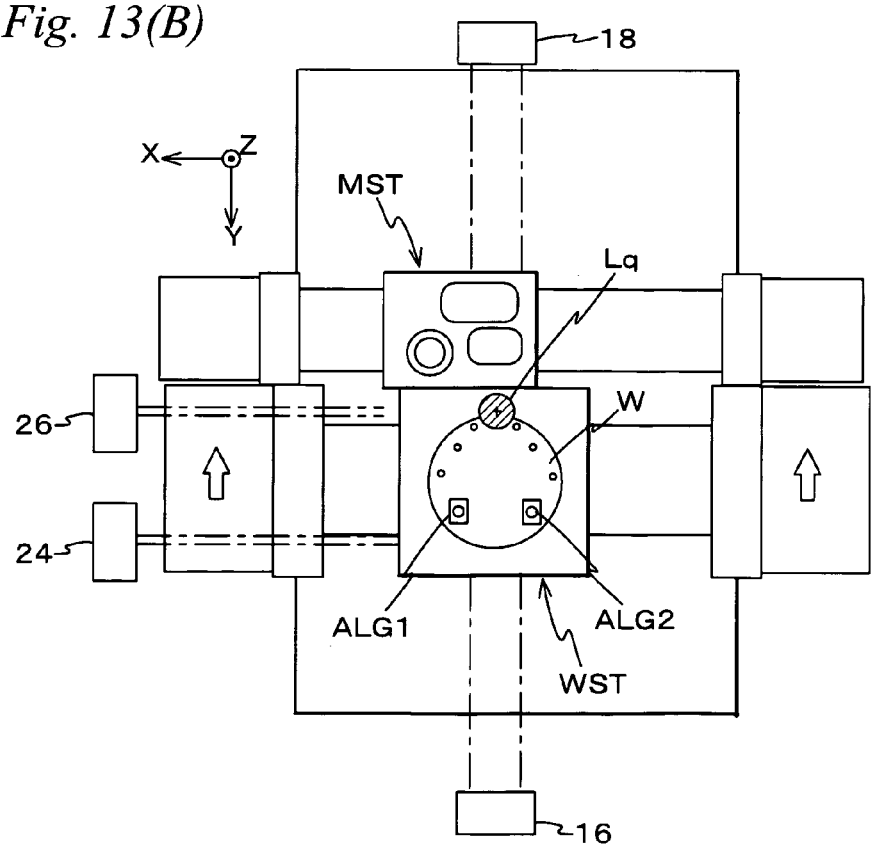

Then, when the second detection operation is completed, wafer stage WST and alignment systems ALG1 and ALG2 begin deceleration as in the first embodiment, while alignment systems ALG1 and ALG2 also begin to move in the X-axis direction. Then, in a state where wafer stage WST and measurement stage MST are in contact (or closest) as is shown in FIG. 13A, wafer stage WST becomes stationary. In this state, alignment systems ALG1 and ALG2 are also stationary, and detection of a third set of alignment marks (a third detection operation) is performed using alignment systems ALG1 and ALG2.

Then, when the third detection operation is completed, acceleration (movement) of wafer stage WST, alignment systems ALG1 and ALG2 and the like begin as in the first embodiment, and at the point where wafer stage WST, alignment systems ALG1 and ALG2 move into a constant movement at a predetermined speed, and detection of a fourth set of alignment marks (a fourth detection operation) is performed. And, after the fourth detection operation is completed, deceleration of wafer stage WST, alignment systems ALG1 and ALG2 and the like is performed and at the point where the speed becomes zero, detection of a fifth set of alignment marks (a fifth detection operation) is performed.

Figure 14A:
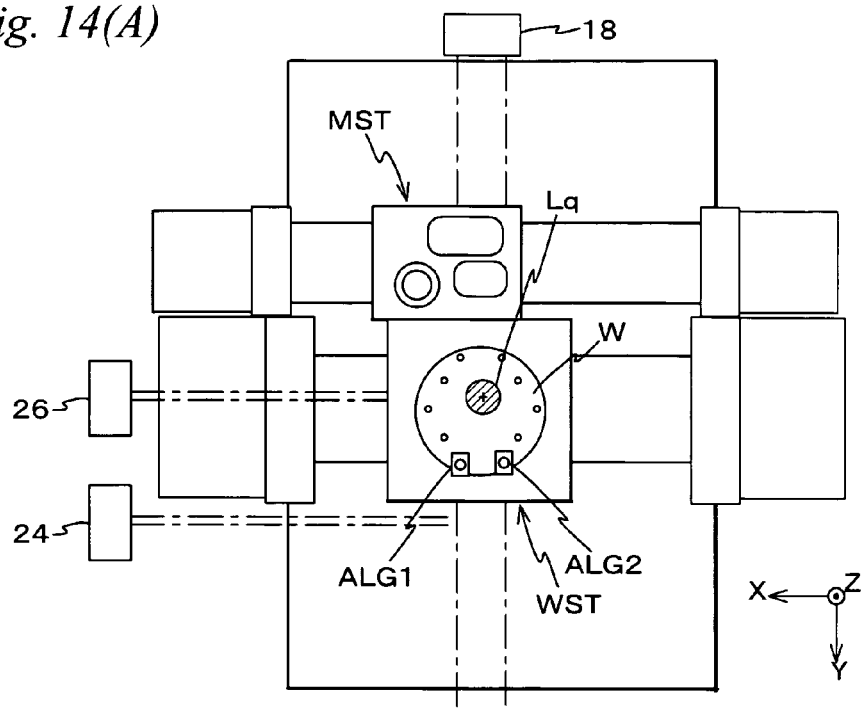
FIGS. 14A and 14B are views (No. 3) for describing the parallel processing operation performed by the wafer stage and the measurement stage related to the second embodiment.
Figure 14B:
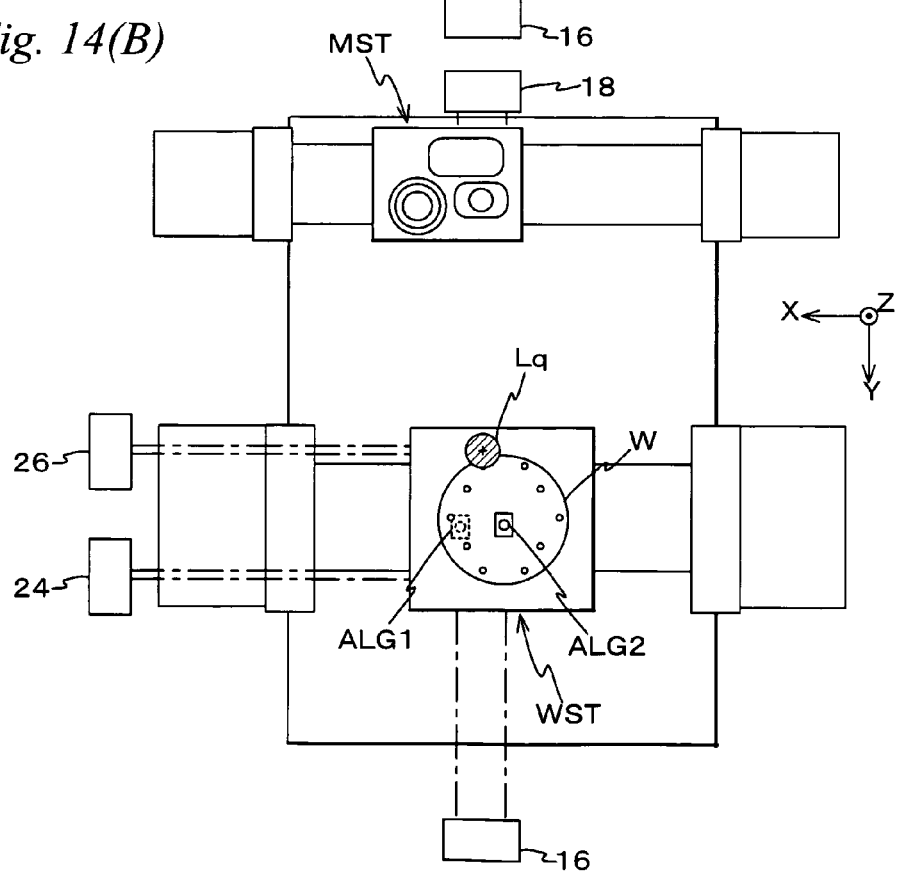

Then, when the fifth detection operation is completed, wafer stage WST moves to the exposure starting position shown in FIG. 14B, and in this state, the alignment mark positioned substantially in the center of wafer W is to be detected using alignment system ALG2.

As is described above, since 11 alignment marks are detected while wafer stage WST moves from the wafer exchange position to the exposure starting position, main controller 50 performs a statistical calculation on the detection results of the 11 alignment marks, and performs alignment by the EGA method (that is, computes the arrangement information of all the shot areas that are to be exposed on the wafer).

After performing the alignment, the exposure operation of wafer W is performed by the step-and-scan method, based on the above alignment results.

As is described above, according to the second embodiment, while wafer stage WST moves from the loading position to the exposure starting position, a part of alignment systems ALG1 and ALG2 are moved and marks on the wafer are detected using alignment systems ALG1 and ALG2, as in the first embodiment. Therefore, time for mark detection does not have to be arranged separately from the movement time of wafer stage WST from the loading position to the exposure starting position, as in the conventional apparatus, which accordingly makes it possible to improve the throughput of the entire exposure process.

In the above second embodiment, the case has been described where detection of 11 alignment marks was performed as an example, however, the detection of the alignment marks can be performed on 10 or less alignment marks, or 12 or more alignment marks.

In each of the above embodiments, the operation of wafer stage WST was suspended during the first, third, fifth detection operation and the detection operation of the $11^{th}$ alignment mark by alignment system AGL2. These detection operations, however, can be performed while wafer stage WST is moving. In this case, wafer stage WST is to be moved so that the speed in the X-axis and Y-axis directions does not become zero at the same time, and detection of the above 11 alignment marks can be performed during this movement. Further, in the case wafer stage WST is moving at a constant speed, by controlling alignment systems ALG1 and ALG2 in the order of, for example, deceleration→acceleration→constant speed, the relative position of wafer W and detection areas of the alignment systems in the Y-axis direction is changed, which makes it possible to perform detection of a plurality of alignment marks on the wafer whose position differs in at least the Y-axis direction. Furthermore, in each of the above embodiments, during the detection operation of the alignment marks, the position of the detection areas of alignment systems ALG1 and ALG2 in the Y-axis direction was the same, however, the position of the detection areas of alignment systems ALG1 and ALG2 in the Y-axis direction can be different.

In each of the above embodiments, the case has been described where wafer stage WST moves along the Y-axis direction, however, the present invention is not limited to this, and wafer stage WST can be moved in a direction intersecting the X-axis and the Y-axis. In this case, the alignment systems are also to be moved in the direction intersecting the X-axis and the Y-axis so that the systems follow the movement of wafer stage WST. Similarly, wafer stage WST can be moved only in the X-axis direction. In this case, it is preferable to make the position of the detection area of a plurality of alignment systems in the Y-axis direction different.

Further, in each of the above embodiments, during the detection operation of a plurality of alignment marks, the detection areas of each of the alignment systems were moved not only in the Y-axis direction but also in the X-axis direction. However, the detection areas of each of the alignment systems can be made to move only in the Y-axis direction. In this case, by each of the alignment systems, a plurality of alignment marks whose position in the X-axis direction on the wafer is the same, or in other words, whose position is different in only the Y-axis direction are detected. Further, by making the detection areas of each of the alignment systems move only in the Y-axis direction, and for example, making wafer stage WST move not only in the Y-axis direction but also in the X-axis direction, or by arranging three or more alignment systems, the position and/or the number of alignment marks to be detected on the wafer can be arbitrarily set, similar to each of the above embodiments.

Further, in each of the above embodiments, in the case of performing detection of the marks on wafer W while wafer stage WST is moving, wafer stage WST and alignment systems ALG1 and ALG2 were moved at a constant speed, however, wafer stage WST and alignment systems ALG1 and ALG2 do not necessarily have to move at a constant speed during mark detection. That is, mark detection can be performed during the acceleration or deceleration of wafer stage WST and alignment systems ALG1 and ALG2. The point is the relative speed between the detection areas of alignment systems ALG1 and ALG2 and the mark only has to be substantially zero. However, in the case of detecting a mark and the mark remains within the detection area of the alignment system, the relative speed between the detection area and the mark does not have to be zero. Further, in each of the above embodiments, both wafer stage WST and the detection areas of the alignment systems were moved while detecting a mark, however, for example, depending on the detection method of the alignment systems, the detection areas of at least the alignment systems do not have to be moved during the mark detection. Furthermore, in each of the above embodiments, wafer stage WST can be stepped in the Y-axis direction only for detecting each of a plurality of marks, without moving both wafer stage WST and the detection areas of the alignment systems during detection of a single mark. In this case, because a plurality of marks on the wafer whose position differs in the X-axis direction is detected using one alignment system, the detection area of the alignment system and/or wafer stage WST can be moved in the X-axis direction during the stepping operation of wafer stage WST in the Y-axis direction.

Furthermore, in each of the above embodiments, wafer stage WST was moved along the Y-axis to the exposure starting position of the wafer after being moved in parallel with the X-axis from the loading position, however, the movement path of wafer stage WST from the loading position to the exposure starting position is not limited to this. For example, wafer stage WST can be moved along a path that has the shortest movement time from the loading position to the exposure starting position, and during this movement, the marks on the wafer can be detected using alignment systems ALG1 and ALG2. Further, the marks on the wafer were detected using alignment systems ALG1 and ALG2 during both the movement from the loading position to the exposure starting position and the exposure operation of the wafer in the above first embodiment, and during the movement from the loading position to the exposure starting position in the above second embodiment. However, for example, the operation can be employed where the mark detection is performed only during the exposure operation of the wafer.

In each of the above embodiments, rotational information of alignment systems ALG1 and ALG2 is measured using alignment system interferometer systems 69 and 169, and the rotational information of alignment systems ALG1 and ALG2 can be used on exposure. In this case, for example, the positional information of the marks can be detected based on the positional information and rotational information of alignment systems ALG1 and ALG2 and the positional information of wafer W.

In each of the above embodiments, the case has been described where the apparatus is equipped with two alignment systems, however, the present invention is not limited to this, and the apparatus can be equipped with one alignment system or three or more alignment systems. Further, in each of the above embodiments, the detection areas were moved by moving alignment systems ALG1 and ALG2 using alignment system stages AST1 and AST2, however, instead of or combined with alignment system stages AST1 and AST2, a mechanism that optically moves the detection areas can be used.

Further, in each of the above embodiments, a separately placed frame FR was used, however, for example, a counter mass method can be applied with respect to stages AST1 and AST2.

Further, in each of the above embodiments, the case has been described where the present invention was employed in an exposure apparatus that has a wafer stage WST and a measurement stage MST. However, the present invention is not limited to this, and for example, the present invention can also be employed in an exposure apparatus that has a twin-stage type stage unit, which is equipped with two wafer stages whose details are disclosed in, for example, Kokai (Japanese Unexamined Patent Publication) No. 10-163099, Kokai (Japanese Unexamined Patent Publication) No. 10-214783 (the corresponding U.S. Pat. No. 6,590,634), Kohyo (Japanese Unexamined Patent Publication) No. 2000-505958 (the corresponding U.S. Pat. No. 5,969,441), U.S. Pat. No. 6,208,407 and the like. In this case, in parallel with the exposure operation of the wafer on one of the wafer stages, mark detection of the wafer can be performed on the other wafer stage, therefore, mark detection is not limited to the case of simply moving the wafer stage in one direction, but can be performed, for example, by making the wafer stage move back and forth along a uniaxial direction, or can be performed by making the wafer stage move along a uniaxial direction and a direction intersecting the uniaxial direction. In this case, by moving each of the alignment systems and the wafer, the time from a state where a mark subject to detection is within the detection field (detection area) of the alignment system until a state where a mark subject to the next detection enters the detection field (detection area) of the alignment system can be reduced. Accordingly, the number of marks that can be detected within a predetermined period of time can be increased, which makes it possible to improve the exposure accuracy.

In each of the above embodiments, in order to simplify the description, in liquid immersion unit 132, one liquid supply nozzle and one liquid recovery nozzle were arranged serving as a nozzle unit. However, the present invention is not limited to this, and as is disclosed in, for example, the pamphlet of International Publication WO99/49504 and the like, a configuration that has many nozzles can be employed. Furthermore, liquid immersion unit 132 can be a unit that has a mechanism of also filling the space between the lowest optical element and its neighboring optical element. The point is that the configuration may be optional, as long as the liquid can be supplied in the space between at least the lowest optical element constituting projection optical system PL and wafer W. For example, a liquid immersion unit mentioned in, for example, European Patent Application Publication No.

1420298 description, the pamphlet of International Publication WO2004/055803, the pamphlet of International Publication WO2004/057590, the pamphlet of International Publication WO2005/029559 (the corresponding U.S. Patent Application Publication 2006/0231206) and the like can be used.

In each of the above embodiments, pure water (water) was used as the liquid; however, it is a matter of course that the present invention is not limited to this. As the liquid, a liquid that is chemically stable with a high transmittance to illumination light IL and is safe to use, such as a fluorine-containing inert liquid may be used. As such as a fluorine-containing inert liquid, for example, Fluorinert (the brand name of 3M United States) can be used. The fluorine-containing inert liquid is also excellent from the point of cooling effect. Further, as the liquid, a liquid that has a refractive index to illumination light IL higher than the refractive index of the pure water (refractive index around 1.44), such as 1.5 or more can be used. As such a liquid, for example, a predetermined liquid that has a C—H bond or an O—H bond as in isopropanol that has a refractive index of around 1.50 or in glycerol (glycerine) that has a refractive index of around 1.61, or a predetermined liquid (an organic solvent) like hexane, heptane, or decane, or decalin (decahydronaphthalene) that has a refractive index of around 1.60 can be given. Or, the liquid can be a mixture of two or more of these predetermined liquids, or the liquid can be pure water that has the above predetermined liquid added (mixed). Or, as the liquid, pure water to which base such as $H^+$, $Cs^+$, $K^+$, $Cl^-$, $SO_4^{2-}$, $PO_4^{2-}$ or the like or acid is added (mixed) can be used. Furthermore, the liquid can be pure water to which particles of aluminum oxide or the like are added (mixed). Such liquids can transmit the ArF excimer laser beam. Further, as the liquid, it is preferable for the liquid to have a small light absorption coefficient, small temperature dependence, and to be stable against the projection optical system (the optical member on the tip), and/or the photosensitive member (or a protection film (a topcoat film), an antireflection film or the like) coated on the surface of the wafer. Further, in the case the $F_2$ laser is used as the light source, Fomblin oil may be used as the fluorine containing liquid.

Further, in each of the above embodiments, the liquid that has been recovered can be re-used, and in this case, it is preferable to arrange a filter for removing impurities from the liquid which has been recovered in the liquid recovery unit, the recovery pipes or the like. Furthermore, in each of the above embodiments, the case has been described where the exposure apparatus is equipped with the whole liquid immersion unit 132 previously described, however, the exposure apparatus does not have to be equipped with a part of liquid immersion unit 132 (e.g. liquid supply unit and/or liquid recovery unit or the like), and these sections can be substituted by the facilities of the factory or the like in which the exposure apparatus is installed. Further, in each of the above embodiments, exposure apparatus equipped with a projection optical system were given as examples, however, the present invention can also be applied to an exposure apparatus that does not use a projection optical system. Even in the case of an apparatus that does not use a projection optical system, illumination light is irradiated on a wafer via an optical member such as a lens, and a liquid immersion area is formed in a space between the optical member and the wafer.

In each of the above embodiments, the case has been described where the present invention was applied to a liquid exposure apparatus, however, the present invention is not limited to this, and it is also possible to apply the present invention to an exposure apparatus other than the liquid exposure apparatus such as, for example, a dry type exposure apparatus that performs exposure of a wafer without going through the liquid.

In each of the above embodiments, the case has been described where the present invention was applied to an exposure apparatus that has a stage unit equipped with both a wafer stage WST and a measurement stage MST, however, the present invention is not limited to this, and it is also possible to apply the present invention to an exposure apparatus equipped that has a stage unit equipped with a single wafer stage. In this case, because the sequence where wafer stage WST and measurement stage MST move in a state where the stages are close together is not required, wafer stage WST does not decelerate between EGA2 and EGA4 in FIG. 11, and the relative positional relation between wafer W and alignment systems ALG1 and ALG2 can be adjusted by the deceleration and acceleration of only alignment systems ALG1 and ALG2.

In each of the above embodiments, the case has been described where interferometers were used as sensors for measuring the position of alignment systems ALG1 and ALG2, however, other sensors such as encoders or the like can be used. Further, in the above embodiments, the positional information of the reticle stage and the wafer stage was measured using the interferometer system, however, besides the interferometer system, for example, an encoder system that detects scales (diffraction gratings) arranged on the upper surface of the wafer stage can also be used. In this case, the sensor can be a hybrid system equipped with both an interferometer system and an encoder system, and it is preferable to perform calibration of the measurement results of the encoder system using the measurement results of the interferometer system. Further, position control of the stage can be performed using the interferometer system or the encoder system by switching the system, or by using both the interferometer system and the encoder system.

In each of the above embodiments, the case has been described where the position of the wafer W surface in the height direction is measured using surface shape detection unit 125 during the movement of the wafer stage from the wafer exchange position to the exposure starting position. However, the measurement is not limited to this, and it is possible to use a focal position detection system by the oblique method, as in the conventional measurement.

Further, the magnification of the projection optical system in the exposure apparatus in each of the above embodiments is not limited to a reduction system, and the system may be either an equal magnifying system or a magnifying system. The projection optical system is not limited to a refracting system, and the system can be either a reflection system or a catadioptric system, and the projected image can be either an inverted image or an upright image. Furthermore, the exposure area on which the illumination light is irradiated via the projection optical system is an on-axis area within the field of projection optical system including the optical axis, however, as is disclosed in, for example, the pamphlet of International Publication WO2004/107011 (the corresponding U.S. Patent Application 2006/0121364), similar to the so-called inline type catodioptric system, which has an optical system (a reflection system or a deflexion system) that has a plurality of reflection surfaces and forms an intermediate image at least once arranged in a part of the catodioptric system and also has a single optical axis, the exposure area can be an off-axis area that does not include optical axis AX.

Further, illumination light IL is not limited to the ArF excimer laser beam (wavelength 193 nm), and illumination light IL can be an ultraviolet light such as the KrF excimer laser beam (wavelength 248 nm) or the like, or a vacuum ultraviolet light such as the $F_2$ laser beam (wavelength 157 nm). As is disclosed in, for example, the pamphlet of International Publication WO1999/46835 (the corresponding U.S. Pat. No. 7,023,610), a harmonic wave may also be used as a vacuum ultraviolet light that is obtained by amplifying a single-wavelength laser beam in the infrared or visible range emitted by a DFB semiconductor laser or fiber laser, with a fiber amplifier doped with, for example, erbium (or both erbium and ytteribium), and by converting the wavelength into ultraviolet light using a nonlinear optical crystal.

Further, in each of the above embodiments, it is a matter of course that as illumination light IL of the exposure apparatus the light is not limited to a light that has a wavelength of 100 nm or more, and a light whose wavelength is less than 100 nm can also be used. For example, in recent years, in order to expose a pattern of 70 nm or under, an EUV exposure apparatus is being developed that generates an EUV (Extreme Ultraviolet) light in the soft X-ray region (e.g. wavelength range of 5 to 15 nm) using an SOR or a plasma laser as a light source and uses an all reflection reduction optical system, which is designed based on the exposure wavelength (e.g. 13.5 nm), and a reflection typed mask. In this apparatus, because the structure of scanning exposure in which the mask and the wafer are synchronously scanned using a circular illumination can be considered, the present invention can also be suitably applied to the apparatus. Besides such apparatus, the present invention can also be applied to an exposure apparatus that uses a charged particle beam such as an electron beam or an ion beam.

Further, in each of the above embodiments, the case has been described where the present invention was applied to a scanning type exposure apparatus by the step-and-scan method, however, besides the apparatus, the present invention can also be applied to a static type exposure apparatus such as a stepper or the like. Further, the present invention can also be applied to an exposure apparatus by the step-and-stitch method that merges a shot area and a shot area.

Further, in each of the above embodiments, a transmittance type mask (reticle) was used, which is a transmissive substrate on which a predetermined light shielding pattern (or a phase pattern or a light attenuation pattern) is formed. Instead of this mask, however, as is disclosed in, for example, U.S. Pat. No. 6,778,257, an electron mask (also called a variable shaped mask, including for example, a DMD (Digital Micromirror Device), which is a kind of a non-radiative image display device (also referred to as a spatial optical modulator), or the like) on which a light-transmitting pattern, a reflection pattern, or an emission pattern is formed according to electronic data of the pattern that is to be exposed can also be used. In the case of using such a variable shaped mask, by taking into consideration the detection results of the alignment marks previously described, on exposure of at least one different shot area on which exposure is to be performed after the shot areas that have been exposed during the alignment mark detection among the plurality of divided areas on the wafer, the light-transmitting pattern or the reflection pattern to be formed is to be changed according to the electronic data so that relative position control of the wafer and the pattern can be performed.

Further, the present invention can also be applied to an exposure apparatus (lithography system) that forms line-and-space patterns on a wafer by forming interference fringes on the wafer. Details of such an apparatus are disclosed in, for example, the pamphlet of International Publication WO2001/035168.

Furthermore, the present invention can also be applied to an exposure apparatus that synthesizes a pattern of a plurality of reticles (or variable shaped masks) on the wafer via the projection optical system, and performs double exposure of an area on the wafer almost simultaneously in one scanning exposure, as is disclosed in, for example, Kohyo (Japanese Unexamined Patent Publication) No. 2004-519850 (the corresponding U.S. Pat. No. 6,611,316).

The above disclosures of the various publications, the pamphlet of the International Publications, and the U.S. Patent descriptions are each incorporated herein by reference.

Further, the apparatus for forming a pattern on an object is not limited to the exposure apparatus (lithography system) previously described, and for example, the present invention can also be applied to an apparatus for forming a pattern on an object by an inkjet method.

The object on which the pattern is to be formed in the above embodiments (the object subject to exposure on which the energy beam is irradiated) is not limited to a wafer, and can be other objects such as, a glass plate, a ceramic substrate, a mask blank, a film member or the like. Further, the shape of the object is not limited to a circular shape, and it can be other shapes such as a rectangular shape or the like.

The usage of the exposure apparatus is not limited to the exposure apparatus for manufacturing semiconductors, and the present invention can also be widely applied to an exposure apparatus used for manufacturing displays such as the liquid crystal display device made of square glass plates or the like, or to an exposure apparatus used for manufacturing organic ELs, thin film magnetic heads, imaging devices (such as CCDs), micromachines, DNA chips and the like. Further, the present invention can also be applied to an exposure apparatus that transfers a circuit pattern onto a glass substrate or a silicon wafer not only when producing microdevices such as semiconductors, but also when producing a reticle or a mask used in exposure apparatus such as an optical exposure apparatus, an EUV exposure apparatus, an X-ray exposure apparatus, an electron beam exposure apparatus and the like.

Semiconductor devices are manufactured through the following steps: a step where the function/performance design of a device is performed; a step where a reticle based on the design step is manufactured; a step where a wafer is manufactured using materials such as silicon; a lithography step where the pattern formed on the reticle is transferred onto an object such as the wafer using the exposure methods described in the embodiments above; a device assembly step (including processes such as a dicing process, a bonding process, and a packaging process); an inspection step, and the like. In this case, in the lithography step, because the exposure methods in the embodiments above are used, high integration devices can be manufactured with good yield.

The exposure apparatus in each of the above embodiments can be made by assembling various subsystems that include each of the components given in the scope of the claims of the present application so that a predetermined mechanical accuracy, electrical accuracy, and optical accuracy are maintained. In order to secure these various accuracies, before and after the assembly, adjustment for achieving the optical accuracy is performed for the various optical systems, adjustment for achieving the mechanical accuracy is performed for the various mechanical systems, and adjustment for achieving the electrical accuracy is performed for the various electric systems. The assembly process from the various subsystems to an exposure apparatus includes mechanical connection, wiring connection of the electric circuits, piping connection of the pressure circuits and the like between the various subsystems. It is a matter of course that prior to the assembly process from the various subsystems to an exposure apparatus, there is an assembly process for each of the individual subsystems. When the assembly process from the various subsystems to an exposure apparatus has been completed, total adjustment is performed, and the various accuracies in the exposure apparatus as a whole are secured. The exposure apparatus is preferably built in a clean room where conditions such as the temperature and the degree of cleanliness are controlled.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A pattern forming method of forming a pattern on a plurality of divided areas of an object, the method comprising:
   a first process of detecting a mark associated with one of the divided areas on the object while the object is being moved; and
   a second process of forming a pattern in the divided areas on the object using the detection results of the associated mark,
   wherein, in the first process, a movement of at least a part of a mark detection system by an image processing method is controlled so that the associated mark is detected by the mark detection system while the object is being moved, and a first part of marks necessary for forming a pattern on all divided areas subject to pattern forming on the object are detected prior to performing the second process.

2. The pattern forming method of claim 1 wherein in the first process, a plurality of marks is detected while changing a position relation between the object and the mark detection system.

3. The pattern forming method of claim 1 wherein in the first process, after a mark detection, at least a part of the mark detection system moves in a direction different from a movement direction of the object until a next mark is detected.

4. The pattern forming method of claim 1 further comprising:
   a third process of detecting a second part of marks necessary for forming a pattern on all the divided areas subject to pattern forming, which are not included in the first part of marks, the third process being performed in parallel with the second process where a pattern is formed on a divided area on which a pattern can be formed, based on the detection results of the marks in the first process.

5. The pattern forming method of claim 1 wherein on the pattern forming, positional information of the mark detection system and positional information of the object are used.

6. The pattern forming method of claim 1 wherein positional information of the associated mark is detected based on positional information of the mark detection system and positional information of the object.

7. The pattern forming method of claim 1 wherein on the pattern forming, rotational information of the mark detection system is used.

8. The pattern forming method of claim 1 wherein positional information of the associated mark is detected based on positional information and rotational information of the mark detection system and positional information of the object.

9. The pattern forming method of claim 1 wherein in the first process, a plurality of the marks is detected using a plurality of mark detection systems.

10. The pattern forming method of claim 1 wherein in the first process, the associated mark is detected in a state where the object and the mark detection system are relatively stationary.

11. A device manufacturing method including a process of forming a pattern on a sensitive object using the pattern forming method of claim 1.

12. The pattern forming method of claim 1 wherein the object is moved by moving a moving section that holds the object.

13. The pattern forming method of claim 1 wherein the first process is performed at least after the beginning of pattern forming with respect to the object.

14. The pattern forming method of claim 1 wherein information related to a surface shape of the object is detected while the object is being moved by a detection system different from the mark detection system, and the detection results of the surface shape are used in the pattern forming.

15. The pattern forming method of claim 1 wherein a pattern is formed by exposing the object.

16. The pattern forming method of claim 1 wherein in the first process, the associated mark is maintained in a detection area of the mark detection system during the detection of the associated mark.

17. The pattern forming method of claim 12 wherein the first process is performed while the moving section moves at least from a loading position where the object is held by the moving section to a position where the pattern forming with respect to the object begins.

18. The pattern forming method of claim 13 wherein the first process is performed also before the beginning of pattern forming with respect to the object.

19. The pattern forming method of claim 14 wherein at least a part of the detection operation of the information related to the surface shape is performed in parallel with a detection operation of the associated mark.

20. The pattern forming method of claim 15 wherein liquid immersion exposure is performed on the object.

21. The pattern forming method of claim 16 wherein in the first process, the associated mark is substantially static in the detection area of the mark detection system during the detection of the associated mark.

22. A pattern forming method of forming a pattern on a plurality of divided areas of an object, the method comprising:
   a first process of detecting a mark associated with one of the divided areas on the object while the object is being moved; and
   a second process of forming a pattern in the divided areas on the object using the detection results of the associated mark,
   wherein, in the first process, a movement of a detection area of a mark detection system by an image processing method is controlled so that the associated mark is detected by the mark detection system while the object is being moved, and a first part of marks necessary for forming a pattern on all divided areas subject to pattern forming on the object are detected prior to performing the second process.

23. The pattern forming method of claim 22 wherein
in the second process, detection results of a rest of the marks necessary for forming a pattern on all the divided areas detected by the mark detection system after a beginning of pattern forming with respect to the object are also used.

24. A device manufacturing method including a process of forming a pattern on a sensitive object using the pattern forming method of claim 22.

25. The pattern forming method of claim 22 wherein
information related to a surface shape of the object is detected while the object is being moved by a detection system different from the mark detection system, and detection results of the surface shape are used in the pattern forming.

26. The pattern forming method of claim 22 wherein
a pattern is formed by exposing the object.

27. The pattern forming method of claim 22 wherein
in the first process, the associated mark is maintained in the detection area of the mark detection system during the detection of the associated mark.

28. The pattern forming method of claim 22 wherein
in the first process, the object is moved in a first direction in which the plurality of divided areas on which a pattern is to be formed is disposed on the object.

29. The pattern forming method of claim 25 wherein
at least a part of a detection operation of the information related to the surface shape is performed in parallel with a detection operation of the associated mark.

30. The pattern forming method of claim 26 wherein
liquid immersion exposure is performed on the object.

31. The pattern forming method of claim 27 wherein
in the first process, the associated mark is substantially static in the detection area of the mark detection system during the detection of the associated mark.

32. The pattern forming method of claim 28 wherein
in the first process, a plurality of marks is detected whose position in the first direction is different on the object.

33. The pattern forming method of claim 28 wherein
in the first process, marks on the object are detected by a plurality of mark detection systems that have detection areas of different positions in a second direction orthogonal to the first direction.

34. The pattern forming method of claim 33 wherein
in the first process, marks of different positions in the second direction on the object are detected by changing a distance of the detection areas in the second direction.

35. A pattern forming method of forming a pattern on an object wherein
a first mark on the object is detected by a mark detection system, and pattern forming with respect to the object begins using the detection results of the first mark detected before a beginning of pattern forming, whereby
a second mark on the object is detected by the mark detection system even after the beginning of pattern forming, and the detection results of the second mark detected after the beginning of pattern forming are used in the pattern forming,
wherein a pattern is formed in each of a plurality of divided areas on the object, and among the plurality of divided areas, in a first group of divided areas including a divided area on which the pattern is formed first, detection results of the first mark detected before the beginning of pattern forming are used, and in a second group of divided areas different from the first group of divided areas, detection results of the second mark detected after the beginning of pattern forming are used.

36. The pattern forming method of claim 35 wherein
in the second group of divided areas, detection results of the first mark detected before the beginning of pattern forming are also used.

37. The pattern forming method of claim 35 wherein
the pattern forming on the second group of divided areas is performed later than the pattern forming of the first group of divided areas.

38. A device manufacturing method including a process of forming a pattern on a sensitive object using the pattern forming method of claim 35.

39. The pattern forming method of claim 35 wherein
a pattern is formed by exposing the object.

40. The pattern forming method of claim 35 wherein
detection of the first and second marks is performed with a detection area being moved while the object is being moved.

41. The pattern forming method of claim 35 wherein
before the beginning of pattern forming, the object is moved in a first direction and a plurality of marks of different positions in the first direction is detected.

42. The pattern forming method of claim 35 wherein
before the beginning of pattern forming, the object is moved in a first direction in which a plurality of divided areas on which a pattern is to be formed are disposed on the object, and a plurality of marks of different positions in the first direction is detected.

43. The pattern forming method of claim 39 wherein
liquid immersion exposure is performed on the object.

44. The pattern forming method of claim 40 wherein
information related to a surface shape of the object is detected while the object is being moved by a detection system different from the mark detection system, and detection results of the surface shape are used in the pattern forming.

45. The pattern forming method of claim 44 wherein
at least a part of a detection operation of the information related to the surface shape is performed in parallel with a detection operation of the first and second marks.

46. The pattern forming method of claim 41 wherein
marks on the object are detected by a plurality of mark detection systems that have detection areas of different positions in a second direction orthogonal to the first direction.

47. The pattern forming method claim 41 wherein
information related to a surface shape of the object is detected while the object is being moved by a detection system different from the mark detection system, and detection results of the surface shape are used in the pattern forming.

48. The pattern forming method of claim 46 wherein
marks of different positions in the second direction on the object are detected by changing a distance of the detection areas in the second direction.

49. The pattern forming method of claim 47 wherein
at least a part of a detection operation of the information related to the surface shape is performed in parallel with a detection operation of the plurality of marks of different positions.

50. The pattern forming method of claim 42 wherein
at least one of the first mark, the second mark and the plurality of marks on the object are detected by a plurality of mark detection systems that have detection areas of different positions in a second direction orthogonal to the first direction.

51. The pattern forming method of claim 42 wherein
information related to a surface shape of the object is detected while the object is being moved by a detection system different from the mark detection system, and detection results of the surface shape are used in the pattern forming.

52. The pattern forming method of claim 50 wherein
marks of different positions in the second direction on the object are detected by changing a distance of the detection areas in the second direction.

53. The pattern forming method of claim 51 wherein
at least a part of a detection operation of the information related to the surface shape is performed in parallel with a detection operation of the plurality of marks of different positions.

54. A pattern forming apparatus that forms a pattern on an object held by a moving section, the apparatus comprising:
a mark detection system that can have at least a part of the mark detection system moved; and
a control unit that moves the at least the part of the mark detection system configured to detect a mark on the object while the moving section is being moved,
the control unit detecting a part of marks necessary for forming a pattern on all divided areas subject to pattern forming on the object, and detecting a rest of the marks necessary for forming a pattern on all the divided areas subject to pattern forming, in parallel with forming a pattern on a divided area on which a pattern can be formed based on detection results of the part of the marks necessary for forming the pattern.

55. The pattern forming apparatus of claim 54 wherein
a pattern is formed on the object using detection results of at least one of the part of the marks necessary for forming the pattern and the rest of the marks necessary for forming the pattern.

56. The pattern forming apparatus of claim 54 wherein
the control unit controls a movement of the at least the part of the mark detection system so that detection of the mark on the object is performed while the moving section is being moved at least from a loading position where the moving section holds the object to a position where pattern forming with respect to the object begins.

57. The pattern forming apparatus of claim 54 wherein
the control unit controls a movement of the at least the part of the mark detection system so that the at least the part of the mark detection system follows the movement of the moving section when detecting the mark on the object.

58. The pattern forming apparatus of claim 54 wherein
the control unit detects a plurality of marks on the object while changing a positional relation between the object and the mark detection system.

59. The pattern forming apparatus of claim 54 wherein
the control unit moves at least a part of the mark detection system in a direction different from a movement direction of the moving section after a mark detection until a next mark detection.

60. The pattern forming apparatus of claim 54 wherein
the mark detection system has a photodetection element and a cooling mechanism for cooling the photodetection element.

61. The pattern forming apparatus of claim 54, the apparatus further comprising:
a measurement moving section that can move independently from the moving section, and performs measurement necessary for the pattern forming while the object on the moving section is exchanged.

62. The pattern forming apparatus of claim 54, the apparatus further comprising:
a separate moving section that can move independently from the moving section, and holds the object on which detection of the at least one of the part of the marks necessary for forming the pattern and the rest of the marks necessary for forming the pattern is performed by the mark detection system while pattern forming is performed with respect to the object held by the moving section.

63. The pattern forming apparatus of claim 54, the apparatus further comprising:
an optical system that irradiates an illumination light on the object, whereby
a pattern is formed by exposing the object with the illumination light.

64. A device manufacturing method including a process of forming a pattern on a sensitive object using the pattern forming apparatus of claim 54.

65. The pattern forming apparatus of claim 54 wherein
the control unit controls a movement of the at least the part of the mark detection system so that detection of the mark on the object is performed at least after pattern forming has begun on the object.

66. The pattern forming apparatus of claim 54, the apparatus further comprising:
a detection unit that detects positional information of the object in a direction perpendicular to a predetermined plane on which the object moves at each of a plurality of measurement positions disposed between a loading position where the moving section holds the object and a pattern forming starting position with respect to the object.

67. The pattern forming apparatus of claim 54, the apparatus further comprising:
a sensor that detects positional information of the mark detection system, whereby
the positional information of the mark detection system and positional information of the object are used on pattern forming.

68. The pattern forming apparatus of claim 63, the apparatus further comprising:
a liquid supply mechanism that supplies liquid in a space between the optical system and the object, whereby
the object is exposed with the illumination light via the optical system and the liquid.

69. The pattern forming apparatus of claim 65 wherein
the control unit controls a movement of the at least the part of the mark detection system so that detection of the mark on the object is performed also before a beginning of pattern forming with respect to the object.

70. The pattern forming apparatus of claim 66 wherein
the control unit computes information related to a surface shape of the object based on detection results of the detection unit.

71. The pattern forming apparatus of claim 66 wherein
the control unit performs at least a part of a detection operation by the detection unit in parallel with a detection operation of at least one of the part of the marks necessary for forming the pattern and the rest of the marks necessary for forming the pattern.

72. The pattern forming apparatus of claim 67 wherein positional information of the mark on the object is detected based on the positional information of the mark detection system detected by the sensor and the positional information of the object.

73. The pattern forming apparatus of claim 67 wherein the sensor also detects rotational information of the mark detection system, whereby the rotational information of the mark detection system is used on pattern forming.

74. The pattern forming apparatus of claim 67 wherein the sensor includes an interferometer.

75. The pattern forming apparatus of claim 73 wherein positional information of at least one of the part of the marks necessary for forming the pattern and the rest of the marks necessary for forming the pattern is detected based on the positional information and the rotational information of the mark detection system detected by the sensor and the positional information of the object.

76. The pattern forming apparatus of claim 63 wherein the mark detection system is separated in a vibrating manner from a body that supports the optical system.

77. The pattern forming apparatus of claim 63 wherein the optical system includes a projection optical system that projects a pattern on the object, and at least the projection optical system is supported by a body.

78. The pattern forming apparatus of claim 73, the apparatus further comprising:
a sensor that detects positional information of the mark detection system with the body serving as a reference.

79. The pattern forming apparatus of claim 78 wherein the sensor includes an interferometer, and
of the interferometer, at least a branching optical system that branches light into a reference beam and a measurement beam moves with at least a part of the mark detection system, and a reflection surface on which the measurement beam is incident is arranged on the body.

80. The pattern forming apparatus of claim 77, the apparatus further comprising:
a sensor that detects positional information of the mark detection system with the body serving as a reference.

81. The pattern forming apparatus of claim 80 wherein the sensor includes an interferometer, and
of the interferometer, at least a branching optical system that branches light into a reference beam and a measurement beam moves with at least a part of the mark detection system, and a reflection surface on which the measurement beam is incident is arranged on the body.

82. A pattern forming apparatus that forms a pattern on an object held by a moving section, the apparatus comprising:
a mark detection system having a movable member; and
a control unit that controls a translational movement of the movable member in a predetermined direction to cause a detection area of the mark detection system to move and thereby detect a mark on the object while the moving section is being moved.

83. The pattern forming apparatus of claim 82, the apparatus further comprising:
a measurement moving section that can move independently from the moving section, and performs measurement necessary for the pattern forming while the object on the moving section is exchanged.

84. The pattern forming apparatus of claim 82, the apparatus further comprising:
a separate moving section that can move independently from the moving section, and holds the object on which detection of the mark is performed by the mark detection system while pattern forming is performed with respect to the object held by the moving section.

85. A device manufacturing method including a process of forming a pattern on a sensitive object using the pattern forming apparatus of claim 82.

86. The pattern forming apparatus of claim 82 wherein the control unit forms a pattern on the object using detection results of the mark.

87. The pattern forming apparatus of claim 82, the apparatus further comprising:
a detection unit that detects positional information of the object in a direction perpendicular to a predetermined plane on which the object moves at each of a plurality of measurement positions disposed between a loading position where the moving section holds the object and a pattern forming starting position with respect to the object.

88. The pattern forming apparatus of claim 82 wherein the control unit moves the moving section in a first direction where a plurality of divided areas on which a pattern is to be formed is disposed on the object, in parallel with moving the detection area of the mark detection system.

89. The pattern forming apparatus of claim 82, the apparatus further comprising:
an optical system that irradiates an illumination light on the object, wherein
a pattern is formed by exposing the object with the illumination light.

90. The pattern forming apparatus of claim 86 wherein the control unit uses the detection results of the mark on the object by the mark detection system after a beginning of pattern forming with respect to the object.

91. The pattern forming apparatus of claim 87 wherein the control unit computes information related to a surface shape of the object based on detection results of the detection unit.

92. The pattern forming apparatus of claim 87 wherein the control unit performs at least a part of a detection operation by the detection unit in parallel with a detection operation of the mark.

93. The pattern forming apparatus of claim 88 wherein the mark detection system detects a plurality of marks of different positions in the first direction.

94. The pattern forming apparatus of claim 88, the apparatus comprising:
a plurality of mark detection systems, wherein
each of the plurality of mark detection systems has a detection area at a different position in a second direction orthogonal to the first direction.

95. The pattern forming apparatus of claim 94 wherein the control unit detects marks of different positions in the second direction on the object by changing a distance of the detection areas in the second direction on detection of the marks on the object with the mark detection systems while the moving section is being moved.

96. The pattern forming apparatus of claim 89, the apparatus further comprising:
a liquid supply mechanism that supplies liquid in a space between the optical system and the object, wherein
the object is exposed with the illumination light via the optical system and the liquid.

97. The pattern forming apparatus of claim 89 wherein the mark detection system is separated in a vibrating manner from a body that supports the optical system.

98. The pattern forming apparatus of claim 89 wherein
the optical system includes a projection optical system that projects the pattern on the object, and at least the projection optical system is supported by a body.

99. The pattern forming apparatus of claim 97, the apparatus further comprising:
a sensor that detects positional information of the mark detection system with the body serving as a reference.

100. The pattern forming apparatus of claim 99 wherein the sensor includes an interferometer, and
the interferometer has at least a branching optical system, wherein the branching optical system that branches light into a reference beam and a measurement beam moves with at least a part of the mark detection system, and a reflection surface on which the measurement beam is incident is arranged on the body.

101. The pattern forming apparatus of claim 98, the apparatus further comprising:
a sensor that detects positional information of the mark detection system with the body serving as a reference.

102. The pattern forming apparatus of claim 101 wherein the sensor includes an interferometer, and
the interferometer has at least a branching optical system, wherein the branching optical system that branches light into a reference beam and a measurement beam moves with at least a part of the mark detection system, and a reflection surface on which the measurement beam is incident is arranged on the body.

103. A pattern forming apparatus that forms a pattern on an object held by a moving section, the apparatus comprising:
a mark detection system that detects a mark on the object; and
a control unit that controls detection of the mark on the object using the mark detection system and pattern forming with respect to the object, wherein
the control unit detects the mark on the object with the mark detection system and begins pattern forming with respect to the object using the detection results, and after a beginning of pattern forming, continues to detect the mark on the object with the mark detection system and uses the detection results in the pattern forming,
the object has a plurality of divided areas in which a pattern is formed,
the control unit uses:
detection results of the mark detected before the beginning of pattern forming when forming a pattern with respect to a first group of divided areas including a divided area on which the pattern is formed first among the plurality of divided areas, and
detection results of the mark detected after the beginning of pattern forming when forming a pattern with respect to a second group of divided areas different from the first group of divided areas.

104. The pattern forming apparatus of claim 103 wherein the control unit also uses detection results of a mark detected before the beginning of pattern forming when forming a pattern with respect to the second group of divided areas.

105. The pattern forming apparatus of claim 103 wherein the control unit performs the pattern forming on the second group of divided areas later than the pattern forming of the first group of divided areas.

106. The pattern forming apparatus of claim 103 wherein the control unit performs detection of the mark moving a detection area while the object is being moved.

107. The pattern forming apparatus of claim 106 wherein the control unit performs at least a part of a detection operation by a detection unit in parallel with a detection operation of the mark.

108. The pattern forming apparatus of claim 103, the apparatus further comprising:
a measurement moving section that can move independently from the moving section, and performs measurement necessary for the pattern forming while the object on the moving section is exchanged.

109. The pattern forming apparatus of claim 103, the apparatus further comprising:
a separate moving section that can move independently from the moving section, and holds the object on which detection of the mark is performed by the mark detection system while pattern forming is performed with respect to the object held by the moving section.

110. A device manufacturing method including a process of forming a pattern on a sensitive object using the pattern forming apparatus of claim 103.

111. The pattern forming apparatus of claim 103 wherein the control unit moves the moving section in a first direction before the beginning of pattern forming, and detects a plurality of marks of different positions in the first direction on the object.

112. The pattern forming apparatus of claim 103 wherein the control unit moves the moving section in a first direction in which a plurality of divided areas on which a pattern is to be formed are disposed on the object before the beginning of pattern forming, and detects a plurality of marks of different positions in the first direction.

113. The pattern forming apparatus of claim 103, the apparatus further comprising:
a detection unit that detects positional information of the object in a direction perpendicular to a predetermined plane on which the object moves at each of a plurality of measurement positions disposed between a loading position where the moving section holds the object and a pattern forming starting position with respect to the object.

114. The pattern forming apparatus of claim 103, the apparatus further comprising:
an optical system that irradiates an illumination light on the object, whereby
a pattern is formed by exposing the object with the illumination light.

115. The pattern forming apparatus of claim 111, the apparatus comprising:
a plurality of mark detection systems, wherein
each of the plurality of the mark detection systems has a detection area at a different position in a second direction orthogonal to the first direction.

116. The pattern forming apparatus of claim 115 wherein the control unit detects marks of different positions in the second direction on the object by changing a distance of the detection areas in the second direction.

117. The pattern forming apparatus of claim 112, the apparatus comprising:
a plurality of the mark detection systems, wherein
each of the plurality of mark detection systems has a detection area at a different position in a second direction orthogonal to the first direction.

118. The pattern forming apparatus of claim 117 wherein the control unit detects marks of different positions in the second direction on the object by changing a distance of the detection areas in the second direction.

119. The pattern forming apparatus of claim 113 wherein the control unit computes information related to a surface shape of the object based on detection results of the detection unit.

120. The pattern forming apparatus of claim 113 wherein the control unit performs at least a part of a detection operation by the detection unit in parallel with a detection operation of the mark.

121. The pattern forming apparatus of claim 114 wherein the mark detection system is separated in a vibrating manner from a body that supports the optical system.

122. The pattern forming apparatus of claim 114, the apparatus further comprising:

a liquid supply mechanism that supplies liquid in a space between the optical system and the object, whereby the object is exposed with the illumination light via the optical system and the liquid.

123. The pattern forming apparatus of claim 121, the apparatus further comprising:

a sensor that detects positional information of the mark detection system with the body serving as a reference.

124. The pattern forming apparatus of claim 121 wherein the optical system includes a projection optical system that projects a pattern on the object, and at least the projection optical system is supported by the body.

125. The pattern forming apparatus of claim 123 wherein the sensor includes an interferometer, and of the interferometer, at least a branching optical system that branches light into a reference beam and a measurement beam moves with at least a part of the mark detection system, and a reflection surface on which the measurement beam is incident is arranged on the body.

126. The pattern forming apparatus of claim 124, the apparatus further comprising:

a sensor that detects positional information of the mark detection system with the body serving as a reference.

127. The pattern forming apparatus of claim 126 wherein the sensor includes an interferometer, and of the interferometer, at least a branching optical system that branches light into a reference beam and a measurement beam moves with at least a part of the mark detection system, and a reflection surface on which the measurement beam is incident is arranged on the body.

* * * * *

UNITED STATES PATENT AND TRADEMARK OFFICE
CERTIFICATE OF CORRECTION

PATENT NO. : 8,411,271 B2
APPLICATION NO. : 11/646559
DATED : April 2, 2013
INVENTOR(S) : Yuichi Shibazaki It is certified that error appears in the above-identified patent and that said Letters Patent is hereby corrected as shown below:

On the Title Page, Item (56) References Cited, Foreign Patent Documents, delete "JP 11-10816 A" and insert --JP 11-16816 A--;

On the Title Page, Item (56) References Cited, Foreign Patent Documents, delete "JP 3303336 B2" and insert --JP 3303386 B2--; and On the Title Page, Item (56) References Cited, Foreign Patent Documents, delete "WO 99/23092 A" and insert --WO 99/23692 A--.

Signed and Sealed this
Eighteenth Day of June, 2013

Teresa Stanek Rea
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 8,411,271 B2 | Page 1 of 1 |
| APPLICATION NO. | : 11/646559 | |
| DATED | : April 2, 2013 | |
| INVENTOR(S) | : Shibazaki et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 744 days.

Signed and Sealed this
Seventh Day of October, 2014

Michelle K. Lee
*Deputy Director of the United States Patent and Trademark Office*